US012288508B2

(12) United States Patent
Ikeda et al.

(10) Patent No.: US 12,288,508 B2
(45) Date of Patent: **\*Apr. 29, 2025**

(54) DISPLAY APPARATUS WITH DETECTING DEVICE

(71) Applicant: Japan Display Inc., Tokyo (JP)

(72) Inventors: Masanobu Ikeda, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/413,858

(22) Filed: Jan. 16, 2024

(65) Prior Publication Data

US 2024/0185769 A1    Jun. 6, 2024

Related U.S. Application Data

(63) Continuation of application No. 17/485,600, filed on Sep. 27, 2021, now Pat. No. 11,996,033, which is a (Continued)

(30) Foreign Application Priority Data

Mar. 28, 2019   (JP) ................................. 2019-064550

(51) Int. Cl.
*G06F 3/041* (2006.01)
*G06F 3/044* (2006.01)
(Continued)

(52) U.S. Cl.
CPC ............. *G09G 3/32* (2013.01); *G06F 3/0412* (2013.01); *G06F 3/0448* (2019.05);
(Continued)

(58) Field of Classification Search
CPC ... G06F 3/044–047; G06F 2203/04103; G06F 2203/04107; G06F 2203/04111; G06F 2203/04112
See application file for complete search history.

(56) References Cited

U.S. PATENT DOCUMENTS

2012/0249454 A1    10/2012   Teraguchi et al.
2013/0181943 A1    7/2013    Bulea et al.
(Continued)

FOREIGN PATENT DOCUMENTS

CN    102738199 A    10/2012
CN    103293785 A    9/2013
(Continued)

OTHER PUBLICATIONS

Office Action issued in related Taiwanese Patent Application No. 111144082 mailed on Feb. 27, 2024 and English translation of same. 15 pages.
(Continued)

*Primary Examiner* — Roberto W Flores
(74) *Attorney, Agent, or Firm* — K&L Gates LLP

(57) ABSTRACT

A display apparatus with a detecting device includes a substrate, a plurality of pixels provided to the substrate, an inorganic light emitting element provided to each of the pixels, a plurality of detection electrodes arranged in a first direction parallel to the substrate, and a plurality of drive electrodes arranged in a second direction intersecting the first direction and provided intersecting the detection electrodes in planar view seen from a direction perpendicular to the substrate. The detection electrodes each includes a plurality of first linear parts, a plurality of second linear parts extending in a direction intersecting the first linear parts, and a bent part that couples the first linear part and the second linear part, the first linear parts and the second linear parts are metal thin wires, and the drive electrodes are translucent electric conductors.

7 Claims, 17 Drawing Sheets

Related U.S. Application Data continuation of application No. PCT/JP2020/013820, filed on Mar. 26, 2020.

(51) Int. Cl.
  *G06V 40/13* (2022.01)
  *G09G 3/32* (2016.01)
  *H01L 27/15* (2006.01)
  *H01L 33/58* (2010.01)

(52) U.S. Cl.
  CPC ........ *G06V 40/1306* (2022.01); *H01L 27/156* (2013.01); *H01L 33/58* (2013.01); *G09G 2300/0413* (2013.01); *G09G 2300/0426* (2013.01)

(56) References Cited

U.S. PATENT DOCUMENTS

| | | |
|---|---|---|
| 2013/0222297 A1 | 8/2013 | Adachi |
| 2014/0176465 A1 | 6/2014 | Ma et al. |
| 2014/0267683 A1 | 9/2014 | Bibl et al. |
| 2014/0292713 A1 | 10/2014 | Koito et al. |
| 2015/0153779 A1 | 6/2015 | Ko et al. |
| 2015/0206501 A1 | 7/2015 | Kurasawa et al. |
| 2015/0331526 A1 | 11/2015 | Hashida |
| 2015/0356911 A1 | 12/2015 | Mizuhashi et al. |
| 2015/0364523 A1 | 12/2015 | Sato |
| 2016/0019019 A1 | 1/2016 | Ikeda et al. |
| 2016/0103526 A1* | 4/2016 | Sohn ................ G06F 3/0446 345/174 |
| 2016/0313848 A1 | 10/2016 | Rhee |
| 2017/0075462 A1 | 3/2017 | Peng et al. |
| 2017/0139525 A1* | 5/2017 | Jo .................... G06F 3/0446 |
| 2017/0200263 A1* | 7/2017 | Iwami ............... G06F 3/0445 |
| 2017/0213502 A1 | 7/2017 | Henry et al. |
| 2017/0255310 A1 | 9/2017 | Miyamoto et al. |
| 2017/0307933 A1 | 10/2017 | Chen et al. |
| 2017/0337870 A1 | 11/2017 | Lin et al. |
| 2017/0338212 A1 | 11/2017 | Kuo et al. |
| 2017/0344154 A1 | 11/2017 | Lee |
| 2018/0129327 A1 | 5/2018 | Kurasawa et al. |
| 2018/0143721 A1 | 5/2018 | Matsueda et al. |
| 2019/0050076 A1 | 2/2019 | Zhang et al. |
| 2019/0266376 A1 | 8/2019 | He et al. |
| 2020/0083303 A1 | 3/2020 | Bok |
| 2020/0126477 A1 | 4/2020 | Henry et al. |

FOREIGN PATENT DOCUMENTS

| | | |
|---|---|---|
| CN | 103294256 A | 9/2013 |
| CN | 104679369 A | 6/2015 |
| CN | 104798020 A | 7/2015 |
| CN | 105280833 A | 1/2016 |
| CN | 107066159 A | 8/2017 |
| CN | 108074552 A | 5/2018 |
| CN | 108334237 A | 7/2018 |
| CN | 108628483 A | 10/2018 |
| CN | 109154961 A | 1/2019 |
| JP | 2012-212076 A | 11/2012 |
| JP | 2013-178598 A | 9/2013 |
| JP | 2014-191657 A | 10/2014 |
| JP | 2016-512347 A | 4/2016 |
| JP | 2017-162032 A | 9/2017 |
| JP | 2017-529557 A | 10/2017 |
| JP | 2018-77600 A | 5/2018 |
| JP | 2018-088391 A | 6/2018 |
| JP | 2018-097024 A | 6/2018 |
| JP | 6451897 B1 | 1/2019 |
| TW | 201301613 | 1/2013 |
| TW | 201447715 A | 12/2014 |
| WO | 2014/115831 A1 | 7/2014 |
| WO | WO2019/049360 A1 | 3/2019 |

OTHER PUBLICATIONS

Office Action issued in related Japanese Patent Application No. 2023-079938 mailed on Feb. 13, 2024 and English translation of same. 22 pages.

International Search Report issued in International Patent Application No. PCT/JP2020/013820 on Jun. 9, 2020 and English translation of same. 8 pages.

Written Opinion issued in International Patent Application No. PCT/JP2020/013820 on Jun. 9, 2020. 5 pages.

Office Action issued in related Taiwanese Patent Application No. 109110502 on Apr. 12, 2021 and English translation of same. 16 pages.

Office Action issued in related Taiwanese Patent Application No. 110139477 on Feb. 8, 2022 and English translation of same. 18 pages.

Office Action issued in related Japanese Patent Application No. 2019-064550 on Dec. 6, 2022 and English translation of same. 14 pages.

Office Action issued in related Japanese Patent Application No. 2019-064550, mailed on Feb. 28, 2023 and English translation of same. 7 pages.

Taiwanese Office Action and Search Report in corresponding Taiwanese Patent Application No. 111144082, dated Aug. 14, 2023.

Office Action in corresponding Chinese Patent Application No. 202080025349.4, dated Sep. 9, 2023 and English translation of same. 16 pages.

* cited by examiner

DISPLAY APPARATUS WITH DETECTING DEVICE

CROSS-REFERENCE TO RELATED APPLICATION

This application is a continuation of application is a continuation of U.S. patent application Ser. No. 17/485,600, filed on Sep. 27, 2021, which application is a continuation of International Patent Application No. PCT/JP2020/013820 filed on Mar. 26, 2020 which designates the United States, incorporated herein by reference, and which claims the benefit of priority from Japanese Patent Application No. 2019-064550 filed on Mar. 28, 2019, incorporated herein by reference.

BACKGROUND

1. Technical Field

The present disclosure relates to a display apparatus with detecting device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are coupled to an array substrate (or a driver backplane in JP-T-2017-529557). The array substrate includes a pixel circuit (or an electronic control circuit in JP-T-2017-529557) that drives the LED.

Displays provided with LEDs are expected to include a fingerprint sensor for personal identification.

SUMMARY

A display apparatus with a detecting device according to the present disclosure includes a substrate, a plurality of pixels provided to the substrate, an inorganic light emitting element provided to each of the pixels, a plurality of detection electrodes arranged in a first direction parallel to the substrate, and a plurality of drive electrodes arranged in a second direction intersecting the first direction and provided intersecting the detection electrodes in planar view seen from a direction perpendicular to the substrate. The detection electrodes each include a plurality of first linear parts, a plurality of second linear parts extending in a direction intersecting the first linear parts, and a bent part that couples the first linear part and the second linear part, the first linear parts and the second linear parts are metal thin wires, and the drive electrodes are translucent electric conductors.

A display apparatus with a detecting device according to the present disclosure includes a substrate, a plurality of pixels provided to the substrate, an inorganic light emitting element provided to each of the pixels, a plurality of detection electrodes arranged in a first direction parallel to the substrate, and a plurality of drive electrodes arranged in a second direction intersecting the first direction and provided intersecting the detection electrodes in planar view seen from a direction perpendicular to the substrate. The detection electrodes each comprise a plurality of first linear parts, a plurality of second linear parts extending in a direction intersecting the first linear parts, and a first bent part that couples the first linear part and the second linear part, and the first linear parts and the second linear parts are metal thin wires, and the drive electrodes each comprise a plurality of third linear parts, a plurality of fourth linear parts extending in a direction intersecting the third linear parts, and a second bent part that couples the third linear part and the fourth linear part, and the third linear parts and the fourth linear parts are metal thin wires.

DETAILED DESCRIPTION

Figure 1:
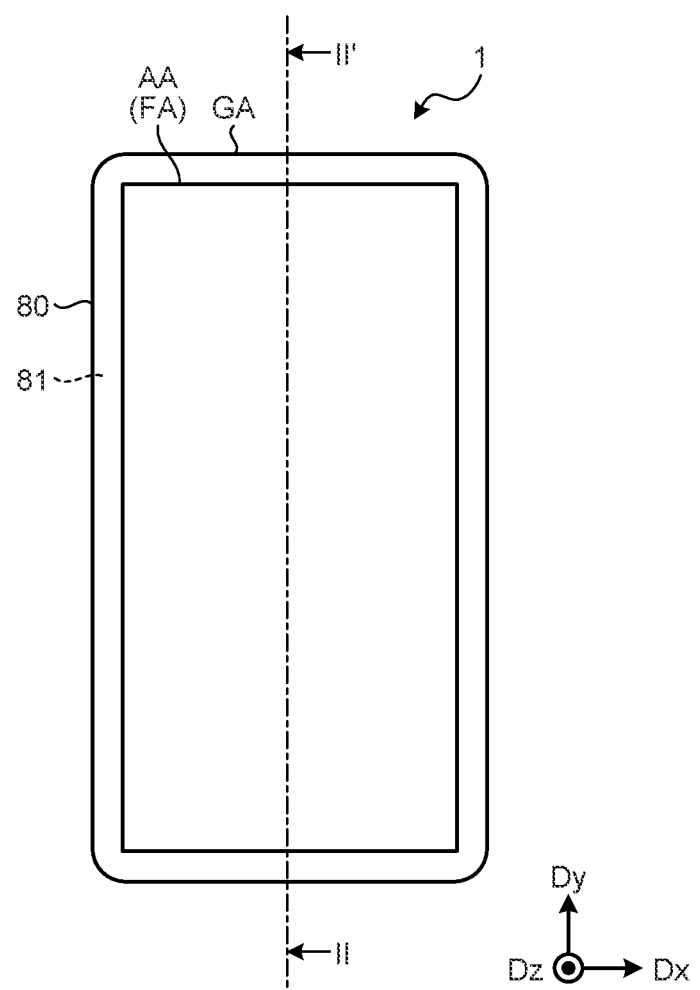
FIG. 1 is a plan view of a display apparatus with a detecting device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a plan view of a display apparatus with a detecting device according to a first embodiment. As illustrated in FIG. 1, a display apparatus 1 with a detecting device has a display region AA, a detection region FA, and a peripheral region GA. The display region AA is a region for displaying an image. The peripheral region GA is provided outside the display region AA and the detection region FA. The detection region FA is a region for detecting recesses and protrusions on the surface of an external object (finger Fin) or the like in contact with or in proximity to a cover member 80. The external object is not limited to the finger Fin and may be any object that can change capacitance formed with at least one of detection electrodes Rx and drive electrodes Tx due to the recesses and protrusions on the surface. The external object may be a palm print, for example.

In the display apparatus 1 with the detecting device according to the present embodiment, the display region AA and the detection region FA are identical or substantially identical. The display apparatus 1 with the detecting device can detect a fingerprint based on the information on the recesses and protrusions on the surface of the finger Fin or the like on the whole area of the display region AA. The shape of the display region AA and the detection region FA is a rectangle, for example. The display region AA and the detection region FA are not necessarily identical, and the detection region FA may overlap part of the display region AA, for example.

Figure 3:
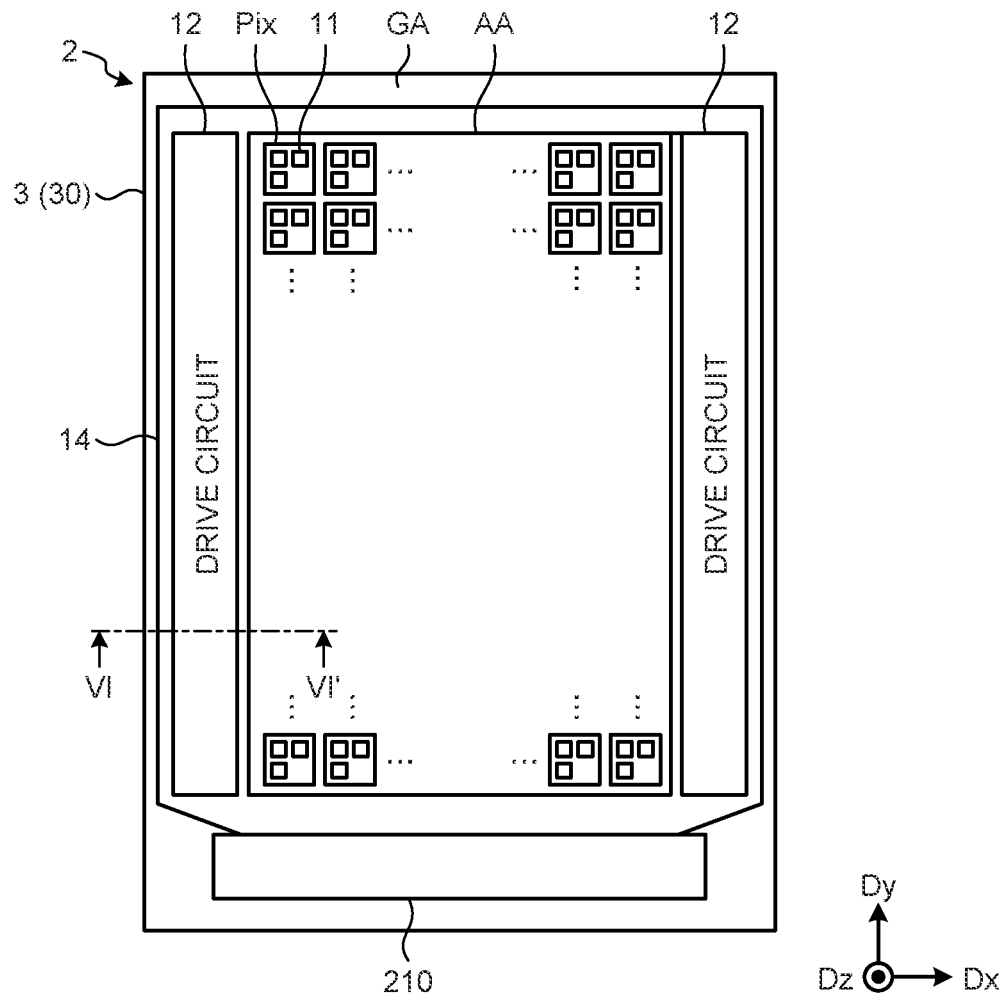
FIG. 3 is a plan view of a display device included in the display apparatus with the detecting device.

In the present specification, the first direction Dx and the second direction Dy are parallel to the surface of a substrate 30 (refer to FIG. 3). The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 30, for example. In the following description, planar view indicates the positional relation when viewed in the third direction Dz.

Figure 2:
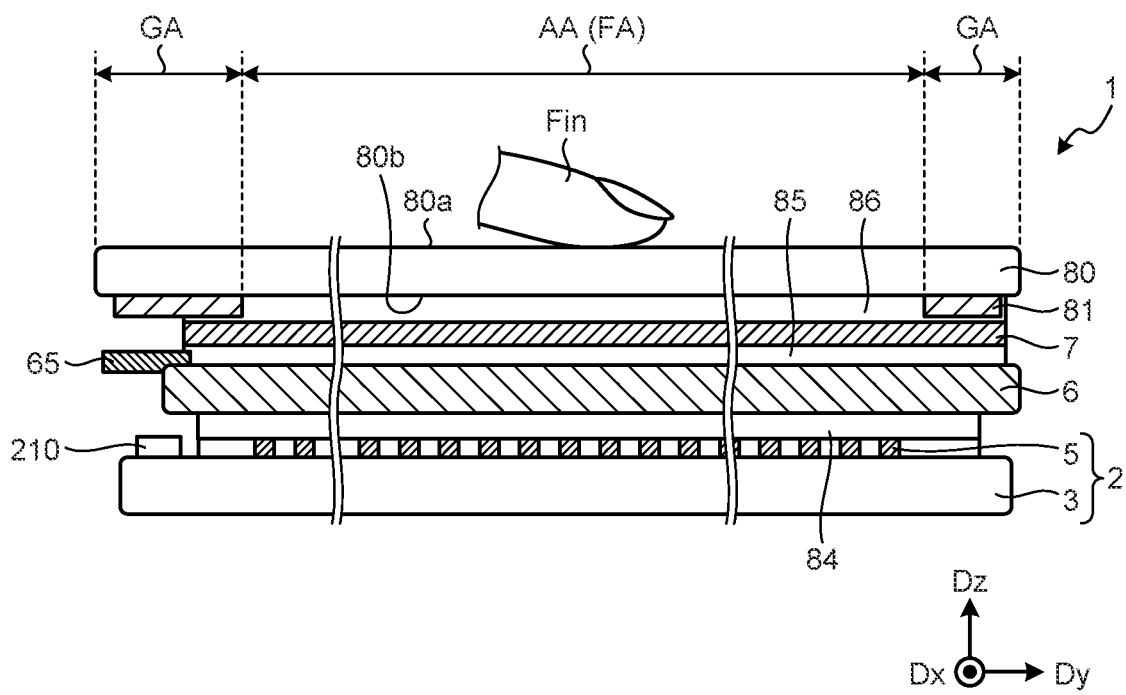
FIG. 2 is a sectional view along line II-II' of FIG. 1.

FIG. 2 is a sectional view along line II-II' of FIG. 1. As illustrated in FIG. 2, the display apparatus 1 with the detecting device includes a display device 2, a detecting device 6, a circularly polarizing plate 7, and the cover member 80. The display device 2, the detecting device 6, the circularly polarizing plate 7, and the cover member 80 are layered in order in the third direction Dz. The display device 2 and the detecting device 6 adhere to each other with a translucent adhesive layer 84 interposed therebetween. The detecting device 6 and the circularly polarizing plate 7 adhere to each other with a translucent adhesive layer 85 interposed therebetween. The circularly polarizing plate 7 and the cover member 80 adhere to each other with a translucent adhesive layer 86 interposed therebetween.

The cover member 80 has a first surface 80a and a second surface 80b opposite to the first surface 80a. The first surface 80a of the cover member 80 serves not only as a detection surface for detecting the recesses and protrusions on the surface of the finger Fin or the like in contact with or in proximity to the display apparatus 1 with the detecting device but also as a display surface on which an observer visually recognizes an image on the display device 2. The cover member 80 is a glass or resin substrate, for example. The cover member 80 is not limited to a plate member and may be a coating layer made of an inorganic or organic insulating film.

In the peripheral region GA, the second surface 80b of the cover member 80 is provided with a decorative layer 81. The decorative layer 81 is a colored layer having light transmittance lower than that of the cover member 80. The decorative layer 81 can prevent wiring, circuits, and other components provided overlapping the peripheral region GA from being visually recognized by the observer. While the decorative layer 81 is provided on the second surface 80b in the example illustrated in FIG. 2, it may be provided on the first surface 80a. The decorative layer 81 is not limited to a single layer and may be composed of a plurality of layers.

The cover member 80, the display device 2, and the detecting device 6 do not necessarily have a rectangular shape in planar view and may have other shapes, such as circular and elliptic shapes and an irregular shape obtained by eliminating part of these outer shapes. The cover member 80 does not necessarily have a plate shape. If the display region AA and the detection region FA have a curved surface, or if the peripheral region GA has a curved surface curved toward the display device 2, for example, the cover member 80 may also have a curved surface. In this case, the display apparatus 1 with the detecting device is a curved screen display with a fingerprint detection function and can detect a fingerprint on the curved surface of the curved screen display.

The following describes the configuration of the display device 2 in greater detail. FIG. 3 is a plan view of the display device included in the display apparatus with the detecting device. As illustrated in FIG. 3, the display device 2 includes an array substrate 3, pixels Pix, drive circuits 12, a drive integrated circuit (IC) 210, and cathode wiring 14. The array substrate 3 is a drive circuit board for driving the pixels Pix and is also called a backplane or an active matrix substrate. The array substrate 3 includes the substrate 30, a plurality of transistors, a plurality of capacitances, and various kinds of wiring, for example.

The pixels Pix are arranged in the first direction Dx and the second direction Dy in the display region AA of the substrate 30. The drive circuits 12 are provided in the peripheral region GA of the substrate 30. The drive circuits 12 drive a plurality of gate lines (e.g., a light emission control scanning line BG, a reset control scanning line RG, an initialization control scanning line IG, and a writing control scanning line SG (refer to FIG. 5)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 2. The drive IC 210 is mounted on the peripheral region GA of the substrate 30 by chip-on-glass (COG) bonding. The mounting form of the drive IC 210 is not limited thereto, and the drive IC 210 may be mounted on a wiring substrate coupled to the peripheral region GA of the substrate 30 by chip-on-film (COF) bonding. The wiring substrate coupled to the substrate 30 is a flexible printed circuit board or a rigid substrate, for example.

The cathode wiring 14 is provided in the peripheral region GA of the substrate 30. The cathode wiring 14 is provided surrounding the pixels Pix in the display region AA and the drive circuits 12 in the peripheral region GA. A cathode terminal 53 (refer to FIG. 6) of respective light emitting elements 5 is electrically coupled to the common cathode wiring 14 and is supplied with a fixed potential (e.g., a ground potential). The cathode wiring 14 may partially have a slit and be provided as two different wires on the substrate 30.

Figure 4:
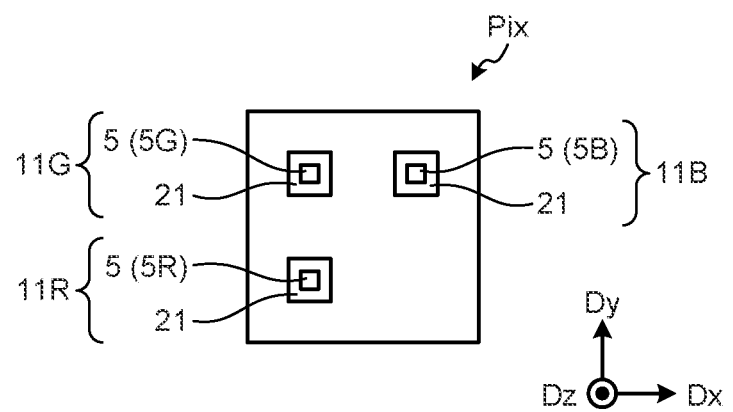
FIG. 4 is a plan view of a plurality of pixels.

FIG. 4 is a plan view of a plurality of pixels. As illustrated in FIG. 4, one pixel Pix includes a plurality of pixels 11. The pixel Pix includes a first pixel 11R, a second pixel 11G, and a third pixel 11B, for example. The first pixel 11R displays a primary color of red as the first color. The second pixel 11G displays a primary color of green as the second color. The third pixel 11B displays a primary color of blue as the third color. As illustrated in FIG. 4, the first pixel 11R and the second pixel 11G disposed side by side in the second direction Dy in one pixel Pix. The second pixel 11G and the third pixel 11B are disposed side by side in the first direction Dx. The first color, the second color, and the third color are not limited to red, green, and blue, respectively, and may be any desired colors, such as complementary colors. In the following description, the first pixel 11R, the second pixel 11G, and the third pixel 11B are referred to as the pixels 11 when they need not be distinguished from one another.

The pixels 11 each include the light emitting element 5 and an anode electrode 21 (first electrode). The display device 2 displays an image by outputting different light (e.g., red, green, and blue light) from the light emitting elements 5R, 5G, and 5B in the first pixel 11R, the second pixel 11G, and the third pixel 11B, respectively. The light emitting elements 5 are provided to each of the pixels 11. The light emitting element 5 is an inorganic light emitting diode (LED) chip having a size of several micrometers to 300 micrometers in planar view. Typically, an element having a chip size of 100 micrometers or larger is called a mini LED, and an element having a size of several micrometers to smaller than 100 micrometers is called a micro LED. The display device 2 according to the present disclosure may include LEDs in any size, and various types of LEDs may be properly used depending on the screen size (size of one pixel) of the display device 2. The display device 2 including the micro LEDs in the respective pixels is also called a micro LED display device. The term "micro" of the micro LED is not intended to limit the size of the light emitting element 5.

The light emitting elements 5 may output different light in four or more colors. The positions of the pixels 11 are not limited to the configuration illustrated in FIG. 4. The first pixel 11R, for example, may be disposed side by side with the second pixel 11G or the third pixel 11B in the first direction Dx. The first pixel 11R, the second pixel 11G, and the third pixel 11B may be repeatedly arranged in this order in the first direction Dx.

Figure 5:
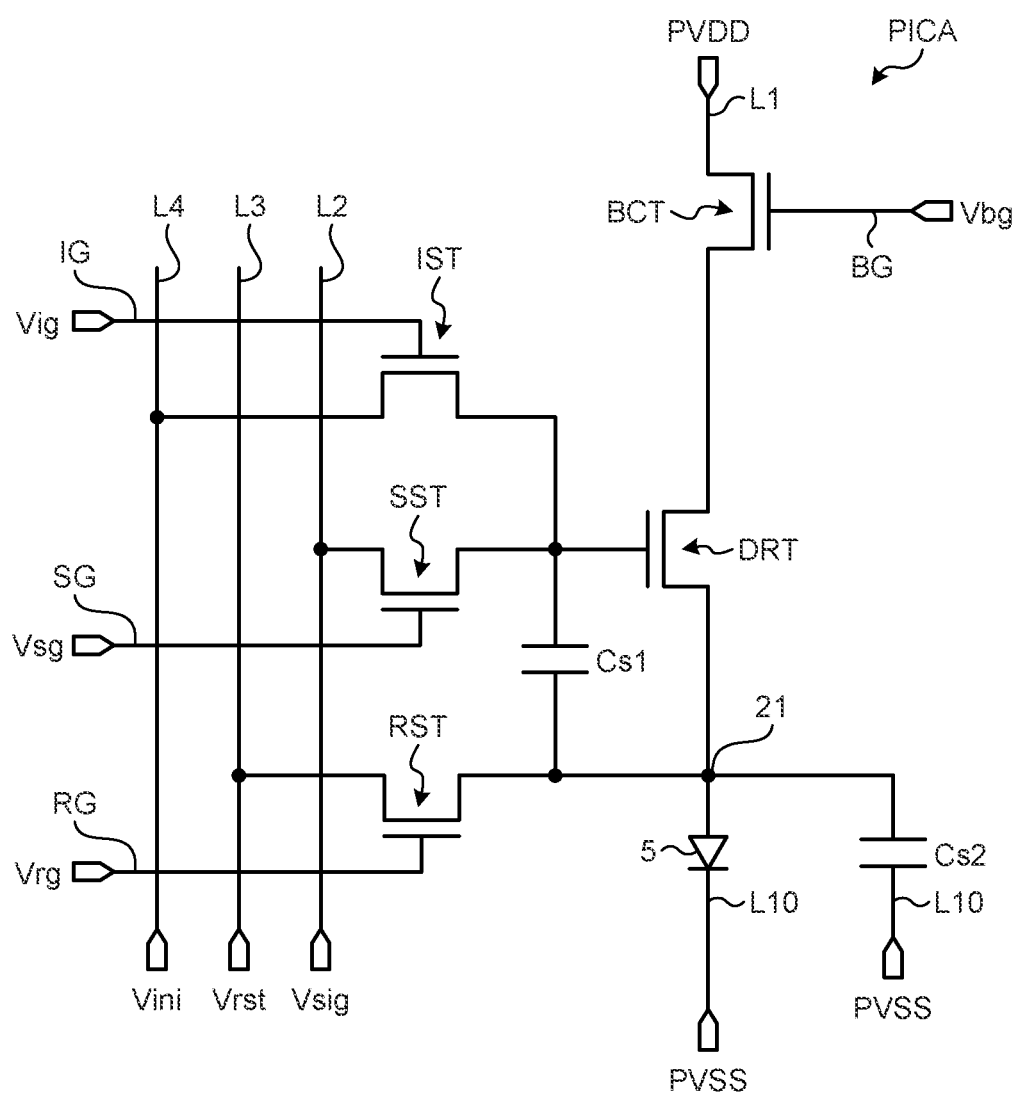
FIG. 5 is a circuit diagram of a pixel circuit.

FIG. 5 is a circuit diagram of a pixel circuit. A pixel circuit PICA illustrated in FIG. 5 is provided to each of the first pixel 11R, the second pixel 11G, and the third pixel 11B. The pixel circuit PICA is provided to the substrate 30 to supply drive signals (electric current) to the light emitting elements 5. The explanation of the pixel circuit PICA with reference to FIG. 5 is applicable to the respective pixel circuits PICA included in the first pixel 11R, the second pixel 11G, and the third pixel 11B.

As illustrated in FIG. 5, the pixel circuit PICA includes the light emitting element 5, five transistors, and two capacitances. Specifically, the pixel circuit PICA includes a light emission control transistor BCT, an initialization transistor IST, a writing transistor SST, a reset transistor RST, and a drive transistor DRT. Some of the transistors may be shared by the pixels 11 disposed side by side.

The transistors included in the pixel circuit PICA are n-type TFTs (thin-film transistors). The present embodiment is not limited thereto, and the transistors may be p-type TFTs.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 3). The drive circuits 12 supply light emission control signals Vbg, initialization control signals Vig, writing control signals Vsg, and reset control signals Vrg to the light emission control scanning line BG, the initialization control scanning line IG, the writing control scanning line SG, and the reset control scanning line RG, respectively.

The drive IC 210 (refer to FIG. 3) supplies video signals Vsig to the respective pixel circuits PICA of the first pixel 11R, the second pixel 11G, and the third pixel 11B in a time-division manner. A switching circuit, such as a multiplexer, is provided between each row of the first pixels 11R, the second pixels 11G, and the third pixels 11B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the light emitting element 5 based on voltage between the gate and the drain.

The cathode (cathode terminal 53) of the light emitting element 5 is coupled to a cathode power supply line L10. The anode (anode terminal 52) of the light emitting element 5 is coupled to an anode power supply line L1 (first power supply line) via the drive transistor DRT and the light emission control transistor BCT. The anode power supply line L1 is supplied with anode power supply potential PVDD (first potential). The cathode power supply line L10 is supplied with cathode power supply potential PVSS (second potential). The anode power supply potential PVDD is higher than the cathode power supply potential PVSS. The cathode power supply line L10 includes the cathode wiring 14.

The pixel circuit PICA includes the capacitance Cs1 and the capacitance Cs2. The capacitance Cs1 is capacitance formed between the gate and the source of the drive transistor DRT. The capacitance Cs2 is additional capacitance formed between the cathode power supply line L10 and both the source of the drive transistor DRT and the anode of the light emitting element 5.

In a reset period, the light emission control transistor BCT is turned off (electrically discontinuous state), and the reset transistor RST is turned on (electrically continuous state) based on the electric potential of the light emission control scanning line BG and the reset control scanning line RG. As a result, the source of the drive transistor DRT is fixed to the reset power supply potential Vrst. The reset power supply potential Vrst is set to be a potential such that the potential difference between the reset power supply potential Vrst and the cathode power supply potential PVSS is smaller than the potential difference at which the light emitting element 5 starts to emit light.

Subsequently, the initialization transistor IST is turned on based on the electric potential of the initialization control scanning line IG. The electric potential of the gate of the drive transistor DRT is fixed to the initialization potential Vini by the initialization transistor IST. The drive circuits 12 turn on the light emission control transistor BCT and turn off the reset transistor RST. When the source potential is equal to (Vini−Vth), the drive transistor DRT is turned off. As a result, variations in a threshold voltage Vth of the drive transistors DRT of the respective pixels 11 are offset.

In a subsequent video signal writing operation period, the light emission control transistor BCT is turned off, the initialization transistor IST is turned off, and the writing transistor SST is turned on. The video signals Vsig are input to the gate of the drive transistor DRT.

In a subsequent light emission operation period, the light emission control transistor BCT is turned on, and the writing transistor SST is turned off. The anode power supply potential PVDD is supplied to the drive transistor DRT from the anode power supply line L1 via the light emission control transistor BCT. The drive transistor DRT supplies an electric current corresponding to the gate-source voltage to the light emitting element 5. The light emitting element 5 emits light with the luminance corresponding to the electric current.

The configuration of the pixel circuit PICA illustrated in FIG. 5 is given by way of example only and may be appropriately modified. The number of wires and the number of transistors in one pixel 11, for example, may be different from those described above.

Figure 6:
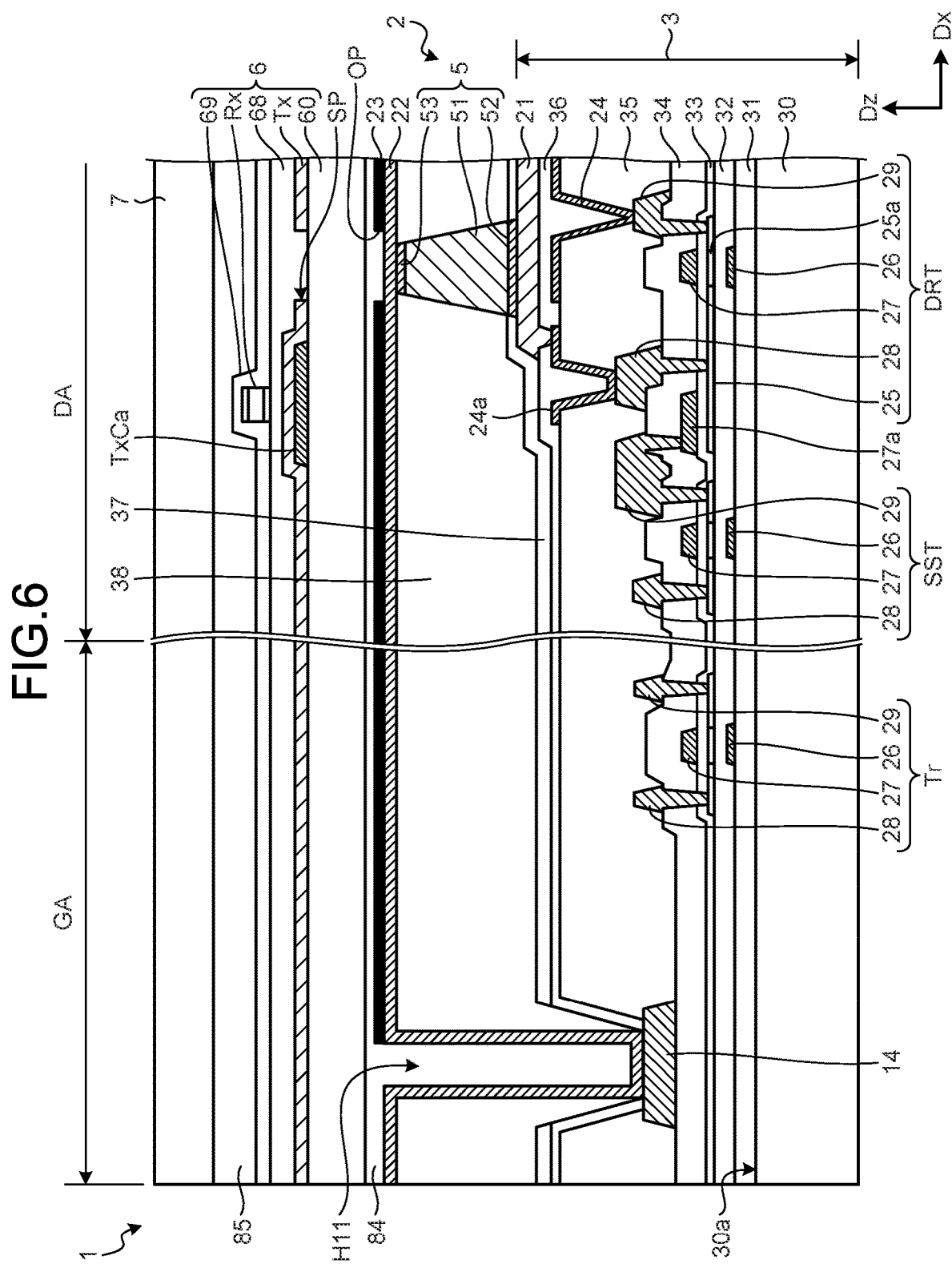
FIG. 6 is a sectional view of the display apparatus with the detecting device along line VI-VI' of FIG. 3.

The following describes a sectional configuration of the display apparatus 1 with the detecting device. FIG. 6 is a sectional view of the display apparatus with the detecting device along line VI-VI' of FIG. 3. As illustrated in FIG. 6, the light emitting element 5 is provided on the array substrate 3 in the display device 2. The array substrate 3 includes the substrate 30, the anode electrode 21, a counter electrode 24, a coupling electrode 24a, various kinds of transistors, various kinds of wiring, and various kinds of insulating films.

The substrate 30 is an insulating substrate and is a glass substrate made of quartz or non-alkali glass or a resin substrate made of polyimide, for example.

In the present specification, a direction from the substrate 30 toward the light emitting element 5 in a direction perpendicular to the surface of the substrate 30 is referred to as an "upper side" or simply as "up". A direction from the light emitting element 5 to the substrate 30 is referred to as a "lower side" or simply as "down". To describe an aspect where a first structure is disposed on a second structure, the term "on" includes both of the following cases unless otherwise noted: a case where the first structure is disposed directly on the second structure in contact with the second structure, and a case where the first structure is disposed on the second structure with another structure interposed therebetween.

An undercoat film 31 is provided on the substrate 30. The undercoat film 31, insulating films 32, 33, and 34, and insulating films 36 and 37 are inorganic insulating films made of silicon oxide ($SiO_2$) or silicon nitride (SiN), for example.

The drive transistor DRT is provided on the undercoat film 31. While FIG. 6 illustrates the drive transistor DRT and the writing transistor SST out of the transistors, the light emission control transistor BCT, the initialization transistor IST, and the reset transistor RST included in the pixel circuit PICA also have the same multilayered structure as that of the drive transistor DRT. A transistor Tr included in the drive circuits 12 is provided in the peripheral region GA.

The drive transistor DRT includes a semiconductor layer 25, a first gate electrode 26, a second gate electrode 27, a source electrode 28, and a drain electrode 29. The first gate electrode 26 is provided on the undercoat film 31. The insulating film 32 is provide on the undercoat film 31 to cover the first gate electrode 26. The semiconductor layer 25 is provided on the insulating film 32. The semiconductor layer 25 is made of polycrystalline silicon, for example. The material of the semiconductor layer 25 is not limited thereto, and the semiconductor layer 25 may be made of a microcrystalline oxide semiconductor, an amorphous oxide semiconductor, or low-temperature polycrystalline silicon, for example.

The insulating film 33 is provided on the insulating film 32 to cover the semiconductor layer 25. The second gate electrode 27 is provided on the insulating film 33. In the semiconductor layer 25, the part sandwiched by the first gate electrode 26 and the second gate electrode 27 serves as a channel region 25a. While only an n-type TFT is provided as the drive transistor DRT, a p-type TFT may be simultaneously formed.

First wiring 27a is provided in the same layer as that of the second gate electrode 27. The first gate electrode 26, the second gate electrode 27, and the first wiring 27a are made of aluminum (Al), copper (Cu), silver (Ag), molybdenum (Mo), or an alloy film of these metals, for example. The drive transistor DRT has a dual-gate structure provided with the first gate electrode 26 and the second gate electrode 27. The structure of the drive transistor DRT is not limited thereto, and the drive transistor DRT may have a bottom-gate structure provided with the first gate electrode 26 alone or a top-gate structure provided with the second gate electrode 27 alone.

The source electrode 28 and the drain electrode 29 are each coupled to the semiconductor layer 25 through a contact hole formed in the insulating films 33 and 34. The source electrode 28 and the drain electrode 29 are multilayered films of TiAlTi or TiAl, which is a multilayered structure of titanium (Ti) and Al, for example.

The first wiring 27a and the source electrode 28 facing each other with the insulating film 34 interposed therebetween form capacitance Cs1. The capacitance Cs1 includes capacitance formed by the semiconductor layer 25 and the first wiring 27a facing each other with the insulating film 33 interposed therebetween.

While the configuration of the drive transistor DRT out of the transistors have been described with reference to FIG. 6, the transistors included in the pixel circuit PICA, such as the writing transistor SST, and the transistor Tr provided in the peripheral region GA also have the same sectional structure as that of the drive transistor DRT. For this reason, detailed explanation of the transistors is omitted herein.

The insulating film 35 is provided on the insulating film 34 to cover the drive transistor DRT. The insulating film 35 is made of organic material, such as photosensitive acrylic.

The insulating film 35 is a flattening film and can flatten unevenness formed by the drive transistor DRT and various kinds of wiring.

The counter electrode 24, the insulating film 36, the anode electrode 21, and the insulating film 37 are layered in order on the insulating film 35. The counter electrode 24 is made of translucent conductive material, such as indium tin oxide (ITO). The coupling electrode 24a is provided in the same layer as that of the counter electrode 24. The coupling electrode 24a is coupled to the source electrode 28 at the bottom of a contact hole.

The anode electrode 21 is electrically coupled to the coupling electrode 24a and the source electrode 28 through a contact hole formed in the insulating film 36. As a result, the anode electrode 21 is electrically coupled to the drive transistor DRT. The anode electrode 21 has a multilayered structure of Mo and Al, for example. The anode electrode 21 may be made of metal or alloy including at least one of Mo and Ti or translucent conductive material.

The capacitance Cs2 is formed between the anode electrode 21 and the counter electrode 24 facing each other with the insulating film 36 interposed therebetween. The insulating film 37 is provided to cover the anode electrode 21. The insulating film 37 covers the periphery of the anode electrode 21 and insulates the anode electrodes 21 of the pixels 11 disposed side by side.

The insulating film 37 has an opening for mounting the light emitting element 5 at a position overlapping the anode electrode 21. The size of the opening of the insulating film 37 is larger than the area of the light emitting element 5 considering the amount of mounting misalignment in the process of mounting the light emitting element 5, for example.

The light emitting element 5 includes a semiconductor layer 51, the anode terminal 52 (first terminal), and the cathode terminal 53 (second terminal). The light emitting element 5 is mounted such that the anode terminal 52 is in contact with the anode electrode 21. The anode electrode 21 supplies the anode power supply potential PVDD to the anode terminal 52. The semiconductor layer 51 may have a multilayered structure of an n-type cladding layer, an active layer, and a p-type cladding layer.

The semiconductor layer 51 is made of a compound semiconductor, such as gallium nitride (GaN), aluminum indium gallium phosphorous (AlInGaP), aluminum gallium arsenide (AlGaAs), and gallium arsenide phosphorous (GaAsP). The semiconductor layer 51 may be made of different materials depending on the light emitting elements 5R, 5G, and 5B. The active layer may have a multi-quantum well structure (MQW structure) in which well layers and barrier layers composed of several atomic layers are cyclically layered for high efficiency.

An element insulating film 38 is provided between a plurality of light emitting elements 5. The element insulating film 38 is made of resin material. The element insulating film 38 covers the side surfaces of the light emitting element 5 at least, and the element insulating film 38 is not provided on the cathode terminal 53 of the light emitting element 5. The element insulating film 38 is flattened such that the upper surface of the element insulating film 38 and the upper surface of the cathode terminal 53 form a single plane. The position of the upper surface of the element insulating film 38 may be different from that of the upper surface of the cathode terminal 53.

A cathode electrode 22 (second electrode) covers a plurality of light emitting elements 5 and the element insulating film 38 and is electrically coupled to the light emitting elements 5. More specifically, the cathode electrode 22 is provided over the upper surface of the element insulating film 38 and the upper surface of the cathode terminal 53. The cathode electrode 22 supplies the cathode power supply potential PVSS to the cathode terminal 53. The cathode electrode 22 is made of translucent conductive material, such as ITO. This configuration can effectively extract the light output from the light emitting elements 5 to the outside.

The cathode electrode 22 is coupled to the cathode wiring 14 provided to the array substrate 3 through a contact hole H11 formed outside the display region AA. Specifically, the contact hole H11 is formed in the element insulating film 38 and the insulating film 35, and the cathode wiring 14 is provided on the bottom surface of the contact hole H11. The cathode wiring 14 is provided on the insulating film 34. In other words, the cathode wiring 14 is provided in the same layer and is made of the same material as that of the source electrode 28 and the drain electrode 29. The cathode electrode 22 is continuously provided from the display region AA to the peripheral region GA and is coupled to the cathode wiring 14 at the bottom of the contact hole H11.

A black member 23 is provided on the cathode electrode 22. The black member 23 is a low reflective film made of material having light reflectance lower than that of the anode electrode 21, for example. The black member 23 is made of resin material colored in black, carbon, or metal or metal oxide that shows black by thin-film interference.

The black member 23 has an opening OP in a region overlapping the light emitting element 5. In other words, the cathode electrode 22 is in contact with the adhesive layer 84 in the opening OP on the light emitting element 5. In the part other than the opening OP, the black member 23 provided on the cathode electrode 22 is in contact with the adhesive layer 84. Light output from the light emitting element 5 travels toward the display surface through the opening OP and is displayed as a display image.

Light output sideward or downward from the light emitting element 5 is reflected by various kinds of wiring of the array substrate 3. The black member 23 blocks the light reflected by the array substrate 3, thereby preventing the reflected light from being output toward the display surface. The black member 23 absorbs external light incident on the display surface, thereby preventing the external light from entering into the array substrate 3. This configuration can prevent the reflected light reflected by the array substrate 3 from being visually recognized by the observer. Consequently, the display device 2 can reduce color mixture in light between the pixels 11 and prevent unintended and unnecessary light from being output from the display surface. As a result, the display device 2 can prevent deterioration of the quality of a display image.

The detecting device 6 is provided on the cathode electrode 22 and the black member 23 with the adhesive layer 84 interposed therebetween. The detecting device 6 is a capacitive fingerprint sensor. The detecting device 6 includes a sensor substrate 60, the drive electrodes Tx, the detection electrodes Rx, and insulating films 68 and 69. The sensor substrate 60, the drive electrodes Tx, the insulating film 68, the detection electrodes Rx, and the insulating film 69 are layered in order in the third direction Dz.

The drive electrode Tx is a translucent electric conductor, such as ITO. The detection electrode Rx is a metal thin wire. The detection electrodes Rx and the drive electrodes Tx are provided at positions not overlapping the light emitting elements 5. The light emitting element 5 is provided at a position overlapping a region SP between the drive electrodes Tx disposed side by side. This configuration can prevent light output from the light emitting element 5 from being reflected by the detection electrode Rx and returning to the array substrate 3. In addition, this configuration can prevent reduction in intensity of output light while the output light is passing through the drive electrode Tx.

The circularly polarizing plate 7 is provided on the detecting device 6 with the adhesive layer 85 interposed therebetween. In other words, the light emitting elements 5, the detection electrodes Rx, and the drive electrodes Tx are provided between the substrate 30 and the circularly polarizing plate 7 in the direction perpendicular to the substrate 30. The circularly polarizing plate 7 includes a linearly polarizing plate and a quarter retardation plate (also called a quarter wavelength plate) provided on a first surface of the linearly polarizing plate, for example. The quarter retardation plate is provided at a position closer to the substrate 30 than the linearly polarizing plate is.

External light (incident light), for example, passes through the linearly polarizing plate, thereby being converted into linearly polarized light. The linearly polarized light passes through the quarter retardation plate, thereby being converted into circularly polarized light. The circularly polarized light is reflected by the detection electrodes Rx and the wiring of the array substrate 3, thereby being converted into circularly polarized light (reflected light) turning in a direction opposite to the direction of the incident light. The reflected light passes through the quarter retardation plate again, thereby being converted into linearly polarized light orthogonal to the incident light and absorbed by the linearly polarizing plate. As a result, the display apparatus 1 with the detecting device prevents reflection of external light.

The cathode electrode 22 is provided between the detecting device 6 and the array substrate 3 in the third direction Dz. The cathode electrode 22 also functions as a shielding layer for the detecting device 6 because it is supplied with a fixed potential. In other words, the cathode electrode 22 can prevent fluctuations in the electric potential generated in the transistors and the various kinds of wiring included in the array substrate 3 from being transmitted to the detecting device 6 as noise.

Figure 7:
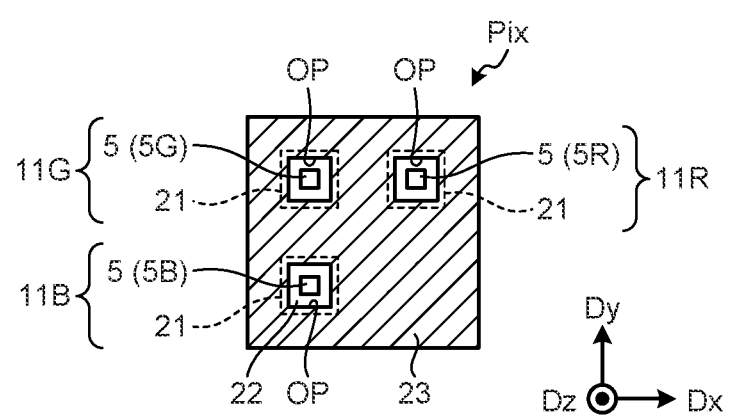
FIG. 7 is a plan view of a plurality of pixels and a cathode electrode.

FIG. 7 is a plan view of a plurality of pixels and the cathode electrode. In FIG. 7, the black member 23 is hatched. As illustrated in FIG. 7, the black member 23 is continuously provided between the pixels 11 disposed side by side. The light emitting elements 5 are each provided in a region having the opening OP. The area of the opening OP in planar view is larger than that of the light emitting element 5. The area of the opening OP in planar view is larger than at least the area of the upper surface of the light emitting element 5.

With this configuration, the transistors and the various kinds of wiring included in the pixel circuit PICA (refer to FIG. 5) are covered with the black member 23. Consequently, the black member 23 can satisfactorily prevent external light from being reflected by the array substrate 3.

Figure 8:
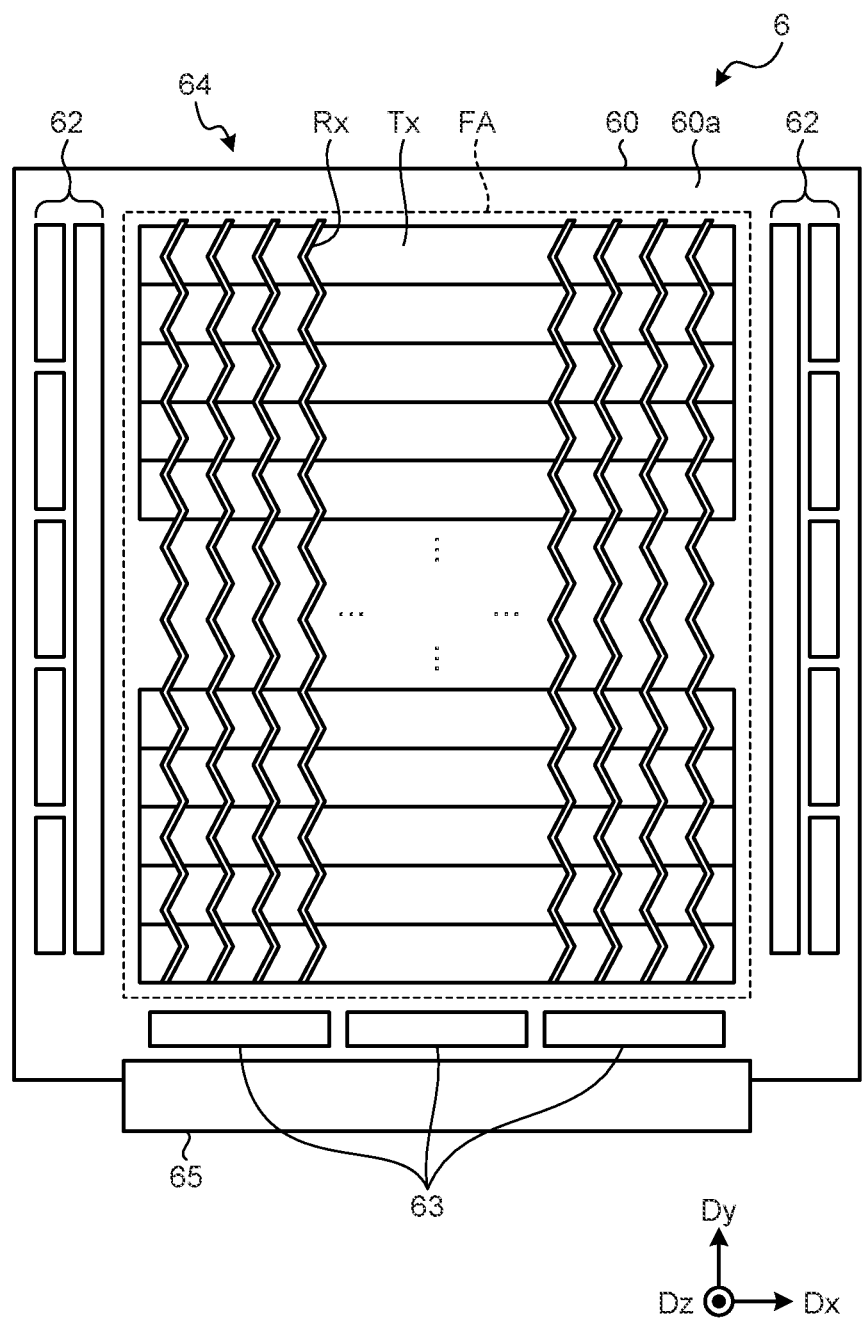
FIG. 8 is a plan view of the detecting device included in the display apparatus with the detecting device.

The following describes the configuration of the detecting device 6 in greater detail. FIG. 8 is a plan view of the detecting device included in the display apparatus with the detecting device. As illustrated in FIG. 8, the detecting device 6 includes the sensor substrate 60, a sensor unit 64, a drive electrode driver 62, and a detection electrode selection circuit 63. The sensor unit 64 is provided on a first surface 60a of the sensor substrate 60. The sensor unit 64 includes the drive electrodes Tx and the detection electrodes Rx. The sensor substrate 60 is a translucent glass substrate that allows visible light to pass therethrough. Alternatively, the sensor substrate 60 may be a translucent resin substrate or film made of resin, such as polyimide. The sensor unit 64 is a translucent sensor.

The drive electrodes Tx and the detection electrodes Rx are provided in the detection region FA. The drive electrodes Tx are disposed side by side in the second direction Dy. The drive electrodes Tx extend in the first direction Dx. The detection electrodes Rx are disposed side by side in the first direction Dx. The detection electrodes Rx extend in the second direction Dy. The drive electrodes Tx intersect the detection electrodes Rx in planar view.

The drive electrode driver 62 and the detection electrode selection circuit 63 are provided in the peripheral region GA of the sensor substrate 60. The drive electrodes Tx are electrically coupled to the drive electrode driver 62. The detection electrodes Rx are electrically coupled to a wiring substrate 65 provided in the peripheral region GA of the sensor substrate 60 via the detection electrode selection circuit 63. The wiring substrate 65 is a flexible printed circuit board, for example. Alternatively, the wiring substrate 65 may be a rigid substrate.

Capacitances are formed at the intersections of the detection electrodes Rx and the drive electrodes Tx. To perform a mutual capacitance touch detection operation in the sensor unit 64, the drive electrode driver 62 sequentially selects the drive electrodes Tx in a time-division manner and supplies drive signals Vs to the selected drive electrode Tx. The detection electrodes Rx output detection signals Vdet based on a change in capacitance between the drive electrode Tx and the detection electrodes Rx caused by the recesses and protrusions on the surface of the finger Fin or the like in contact with or in proximity to the sensor unit 64. With this mechanism, the sensor unit 64 performs fingerprint detection. The drive electrode driver 62 may sequentially select and drive drive electrode blocks each including a plurality of drive electrodes Tx.

While various kinds of circuits, such as the drive electrode driver 62 and the detection electrode selection circuit 63, are provided in the peripheral region GA of the sensor substrate 60 in FIG. 8, this configuration is given by way of example only. At least part of the various kinds of circuits may be included in a detection IC mounted on the wiring substrate 65. Alternatively, at least part of the various kinds of circuits may be included in the drive IC 210 (refer to FIG. 3) of the display device 2.

Figure 9:
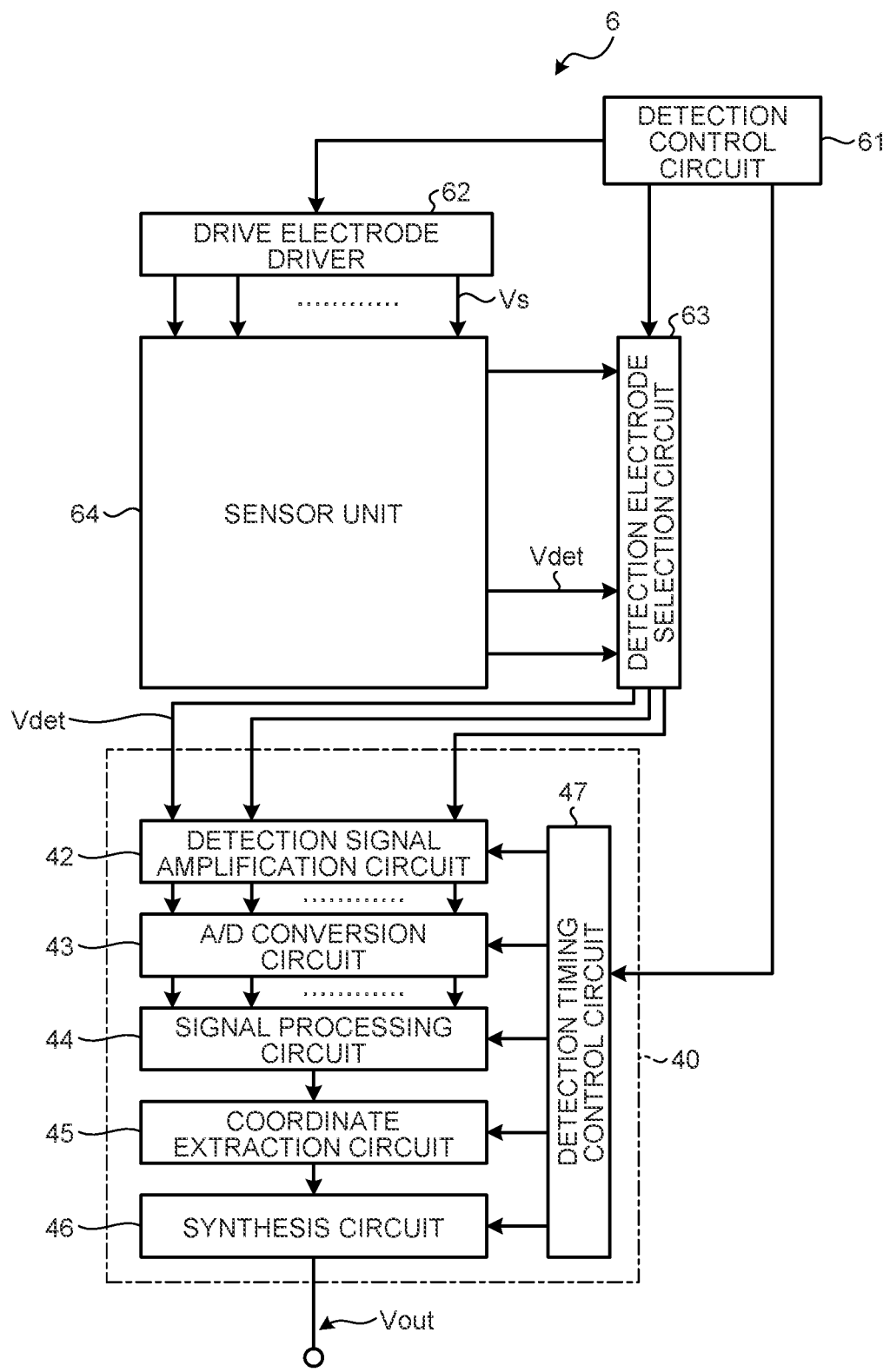
FIG. 9 is a block diagram of an exemplary configuration of the detecting device.

FIG. 9 is a block diagram of an exemplary configuration of the detecting device. As illustrated in FIG. 9, the detecting device 6 further includes a detection control circuit 61 and a detection circuit 40. The detection control circuit 61 controls operations of the sensor unit 64, the detection electrode selection circuit 63, the drive electrode driver 62, and the detection circuit 40.

The drive electrode driver 62 is a circuit that supplies the drive signals Vs for detection to the drive electrodes Tx of the sensor unit 64 based on the control signals supplied from the detection control circuit 61. The drive signal Vs is an AC rectangular wave at a predetermined frequency (e.g., a frequency of the order of several kilohertz to several hundred kilohertz), for example. The AC waveform of the drive signal Vs may be a sine wave or a triangle wave. The detection electrode selection circuit 63 selects the detection electrode Rx of the sensor unit 64 based on the control signals supplied from the detection control circuit 61 and couples it to the detection circuit 40. The detection electrode selection circuit 63 is a multiplexer, for example.

The detection circuit 40 detects the shape and the fingerprint of the finger Fin based on the signals supplied from the detection control circuit 61 and the detection signals Vdet output from the detection electrodes Rx. The detection circuit 40 detects a change in the detection signals Vdet corresponding to the recesses and protrusions on the surface of the finger Fin or the like in contact with or in proximity to the sensor unit 64. The detection circuit 40 includes a detection signal amplification circuit 42, an A/D conversion circuit 43, a signal processing circuit 44, a coordinate extraction circuit 45, a synthesis circuit 46, and a detection timing control circuit 47. The detection timing control circuit 47 performs control such that the detection signal amplification circuit 42, the A/D conversion circuit 43, the signal processing circuit 44, the coordinate extraction circuit 45, and the synthesis circuit 46 operate synchronously with one another based on clock signals supplied from the detection control circuit 61.

The detection signals Vdet are supplied from the sensor unit 64 to the detection signal amplification circuit 42 of the detection circuit 40. The detection signal amplification circuit 42 amplifies the detection signals Vdet. The detection signal amplification circuit 42 includes a plurality of integration circuits and a plurality of terminals coupled to the respective integration circuits. The detection electrode selection circuit 63 couples the terminals and the selected detection electrodes Rx. The A/D conversion circuit 43 converts analog signals output from the detection signal amplification circuit 42 into digital signals. The detection signal amplification circuit 42 and the A/D conversion circuit 43 are analog front end (AFE) circuits, for example.

The signal processing circuit 44 is a logic circuit that determines whether the recesses and protrusions of the finger Fin are in contact with or in proximity to the sensor unit 64 based on the output signals from the A/D conversion circuit 43. The signal processing circuit 44 performs processing of extracting a signal (absolute value |ΔV|) of the difference between the detection signals caused by the recesses and protrusions of the finger Fin. The signal processing circuit 44 compares the absolute value |ΔV| with a predetermined threshold voltage. If the absolute value |ΔV| is lower than the threshold voltage, the signal processing circuit 44 determines that the recessed portion of the finger Fin is in a contact state. By contrast, if the absolute value |ΔV| is equal to or higher than the threshold voltage, the signal processing circuit 44 determines that the protruding portion of the finger Fin is in a contact state. As described above, the detection circuit 40 can detect contact or proximity of the recesses and protrusions of the finger Fin.

The coordinate extraction circuit 45 is a logic circuit that calculates, when the signal processing circuit 44 detects contact or proximity of the recesses and protrusions of the finger Fin, the detection coordinates of them. The coordinate extraction circuit 45 outputs the detection coordinates to the synthesis circuit 46. The synthesis circuit 46 combines the detection coordinates output from the coordinate extraction circuit 45, thereby generating two-dimensional information indicating the shape and the fingerprint of the finger Fin in contact with or in proximity to the sensor unit 64. The synthesis circuit 46 outputs the two-dimensional information as output signals Vout from the detection circuit 40. Alternatively, the synthesis circuit 46 may generate an image based on the two-dimensional information and output the image information as the output signals Vout. Still alternatively, the detection circuit 40 do not necessarily include the coordinate extraction circuit 45 or the synthesis circuit 46 and may output the signals acquired by the signal processing circuit 44 as the output signals Vout.

The detection circuit 40 is included in the detection IC described above. Some of the functions of the detection circuit 40 may be included in the drive IC 210 or be provided as functions of an external micro-processing unit (MPU).

Figure 10:
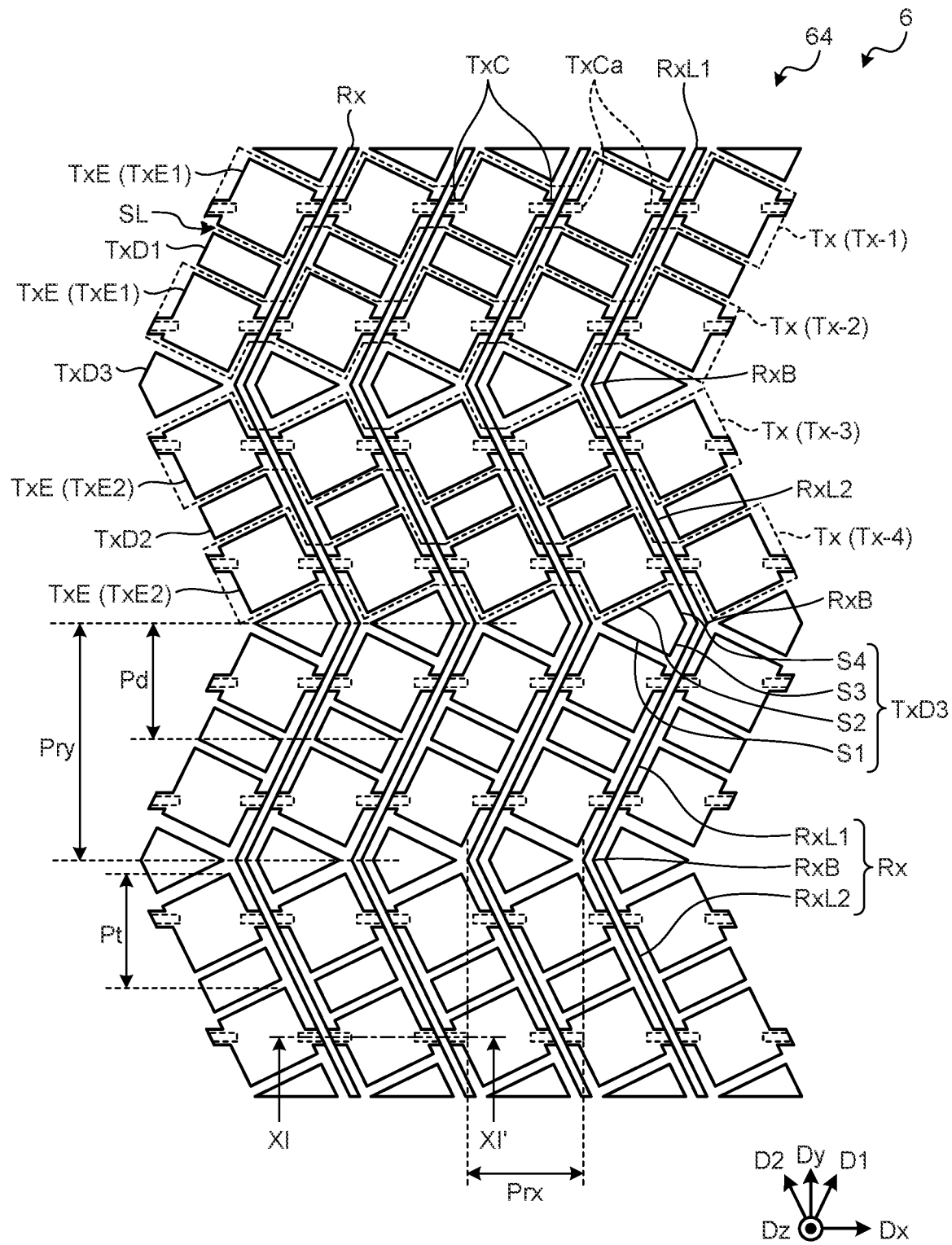
FIG. 10 is a plan view of drive electrodes and detection electrodes.

FIG. 10 is a plan view of the drive electrodes and the detection electrodes. As illustrated in FIG. 10, the detection electrode Rx is a metal thin wire having a zigzag shape in planar view. The detection electrode Rx extends in the second direction Dy as a whole. Specifically, the detection electrode Rx includes a plurality of first linear parts RxL1, a plurality of second linear parts RxL2, and a plurality of bent parts RxB. The second linear part RxL2 extends in a direction intersecting the first linear part RxL1. The first linear parts RxL1 and the second linear parts RxL2 are metal thin wires. The bent part RxB couples the first linear part RxL1 and the second linear part RxL2.

The first linear part RxL1 extends in a D1 direction intersecting the first direction Dx and the second direction Dy. The second linear part RxL2 extends in a D2 direction intersecting the first direction Dx and the second direction Dy. The D1 direction inclines opposite to the D2 direction with respect to the second direction Dy. The angle formed by the D1 direction and the second direction Dy is equal to that formed by the D2 direction and the second direction Dy. The first linear part RxL1 and the second linear part RxL2 are disposed symmetrically about a virtual line parallel to the first direction Dx.

An arrangement pitch Prx is the distance between the bent parts RxB in the first direction Dx in the detection electrodes Rx disposed side by side. An arrangement pitch Pry is the distance between the bent parts RxB in the second direction Dy in each of the detection electrodes Rx. The arrangement pitch Prx according to the present embodiment is smaller than the arrangement pitch Pry, for example.

As illustrated in FIG. 10, a plurality of drive electrodes Tx-1, Tx-2, Tx-3, Tx-4, . . . are disposed side by side in the second direction Dy. The drive electrodes Tx-1 and Tx-2 intersect the first linear parts RxL1 of the respective detection electrodes Rx. The drive electrodes Tx-3 and Tx-4 intersect the second linear parts RxL2 of the respective detection electrodes Rx. In the following description, the drive electrodes Tx-1, Tx-2, Tx-3, Tx-4, . . . are simply referred to as the drive electrodes Tx when they need not be distinguished from one another.

The drive electrodes Tx-1, Tx-2, Tx-3, Tx-4, . . . each include a plurality of electrode parts TxE and a plurality of coupling parts TxC. In the drive electrodes Tx, the electrode parts TxE are disposed side by side in the first direction Dx and are separated from one another. In the drive electrodes Tx, the coupling part TxC couples the electrode parts TxE disposed side by side out of the electrode parts TxE. One detection electrode Rx is arranged or passes through a space between the electrode parts TxE disposed side by side and intersects the coupling parts TxC when viewed from the third direction Dz. The electrode parts TxE and the coupling parts TxC are made of translucent conductive material, such as ITO.

The electrode parts TxE include first electrode parts TxE1 and second electrode parts TxE2 having a shape different from that of the first electrode parts TxE1. The first electrode part TxE1 and the second electrode part TxE2 are parallelograms when viewed from the third direction Dz. The second electrode part TxE2 has a shape obtained by vertically inverting the shape of the first electrode part TxE1.

The drive electrodes Tx-1 and Tx-2 each include a plurality of first electrode parts TxE1. The first electrode parts TxE1 are provided along the first linear part RxL1 and each have a square shape having two sides parallel to the first linear part RxL1 and two sides orthogonal to the first linear part RxL1. The drive electrodes Tx-3 and Tx-4 each include a plurality of second electrode parts TxE2. The second electrode parts TxE2 are provided along the second linear part RxL2 and each have a square shape having two sides parallel to the second linear part RxL2 and two sides orthogonal to the second linear part RxL2.

With this configuration, the first electrode parts TxE1 and the second electrode parts TxE2 are disposed along the zigzag detection electrodes Rx. The distance between the detection electrode Rx and each detection electrode part TxE is a predetermined length. The number of electrode parts TxE corresponding to one first linear part RxL1 or one second linear part RxL2 may be one or an integer of 3 or larger.

Pt denotes the arrangement pitch between the drive electrodes Tx in the second direction Dy. The arrangement pitch Pt is approximately one-half the arrangement pitch Pry between the bent parts RxB of the detection electrode Rx. The present embodiment is not limited thereto, and the arrangement pitch Pt may be one-n-th (n is an integer of 1 or larger) the arrangement pitch Pry. The arrangement pitch Pt is 50 µm to 100 µm, for example.

The longitudinal directions of the coupling parts TxC are preferably aligned in one direction. The longitudinal directions of all the coupling parts TxC of the drive electrode Tx extend along the first direction Dx. In addition, the coupling parts TxC are disposed on the same line. This configuration makes the shapes of the coupling parts TxC intersecting the detection electrodes Rx uniform, thereby preventing variation in capacitance between the detection electrodes Rx and the coupling parts TxC. Metal layers TxCa are provided in regions overlapping the coupling parts TxC. This configuration can reduce the resistance of the multilayered body composed of the coupling part TxC and the metal layer TxCa if the coupling part TxC has a thin width.

The coupling parts TxC are not necessarily provided on the same line, and the coupling parts TxC disposed side by side in the first direction Dx may be disposed at different positions in the second direction Dy. In this case, the metal layers TxCa having light transmittance lower than that of the electrode parts TxE are not disposed on one line. Consequently, the display apparatus 1 with the detecting device can prevent generation of unintended patterns, such as moiré.

While the electrode parts TxE have a parallelogrammic shape, they may have a rectangular, polygonal or irregular shape. The electrode parts TxE, for example, may include third electrode parts, each of which is disposed between the bent parts RxB disposed side by side and has a polygonal shape including a first part having two sides parallel to the first linear part RxL1 and a second part having two sides parallel to the second linear part RxL2. In other words, the number of electrode parts TxE disposed side by side with the partial structure composed of one first linear part RxL1, one second linear part RxL2, and the bent part RxB connecting these linear parts is not limited to an even number and may be an odd number.

Dummy electrodes TxD1, TxD2, and TxD3 are provided between the drive electrodes Tx disposed side by side in the second direction Dy. Specifically, the dummy electrode TxD1 is provided between the first electrode parts TxE1 disposed side by side in the D1 direction, and the dummy electrode TxD2 is provided between the second electrode parts TxE2 disposed side by side in the D2 direction. The dummy electrode TxD3 is provided between the first electrode part TxE1 and the second electrode part TxE2. The dummy electrodes TxD1, TxD2, and TxD3 are separated from the electrode parts TxE with slits SL interposed therebetween. In the following description, the dummy electrodes TxD1, TxD2, and TxD3 are simply referred to as dummy electrodes TxD when they need not be distinguished from one another. The dummy electrodes TxD are made of translucent conductive material, such as ITO, and are made of the same material as that of the drive electrodes Tx.

The dummy electrode TxD1 has a rectangular shape having two sides parallel to the first linear part RxL1 and two sides orthogonal to the first linear part RxL1. The dummy electrode TxD2 has a rectangular shape having two sides parallel to the second linear part RxL2 and two sides orthogonal to the second linear part RxL2. The area of the dummy electrode TxD1 and the dummy electrode TxD2 is smaller than that of the first electrode part TxE1 and the second electrode part TxE2. The dummy electrode TxD3 has a side S1 orthogonal to the first linear part RxL1, a side S2 orthogonal to the second linear part RxL2, a side S3 parallel to the first linear part RxL1, and a side S4 parallel to the second linear part RxL2. An arrangement pitch Pd between the dummy electrodes TxD in the second direction Dy is equal to the arrangement pitch Pt between the drive electrodes Tx.

The slits SL sandwiching the detection electrode Rx are formed not being aligned on the same line. In other words, the electrode part TxE is disposed in the extending direction of the slit SL with the detection electrode Rx sandwiched therebetween. As a result, the parts not provided with the electrode part TxE or the dummy electrode TxD are disposed so as to be bent with a small pitch. Consequently, the detecting device 6 can prevent generation of unintended patterns (e.g., moiré and patterns produced by reflection of light) in the detection region FA.

In the sensor unit 64 illustrated in FIG. 10, the positional relation between the shape of the drive electrodes Tx and the shape of the detection electrodes Rx are uniform between the electrodes. This configuration can reduce variation in capacitance of the drive electrodes Tx and variation in capacitance of the detection electrodes Rx. In addition, this configuration facilitates correction in calculating the coordinates on the sensor unit 64, for example.

Figure 11:
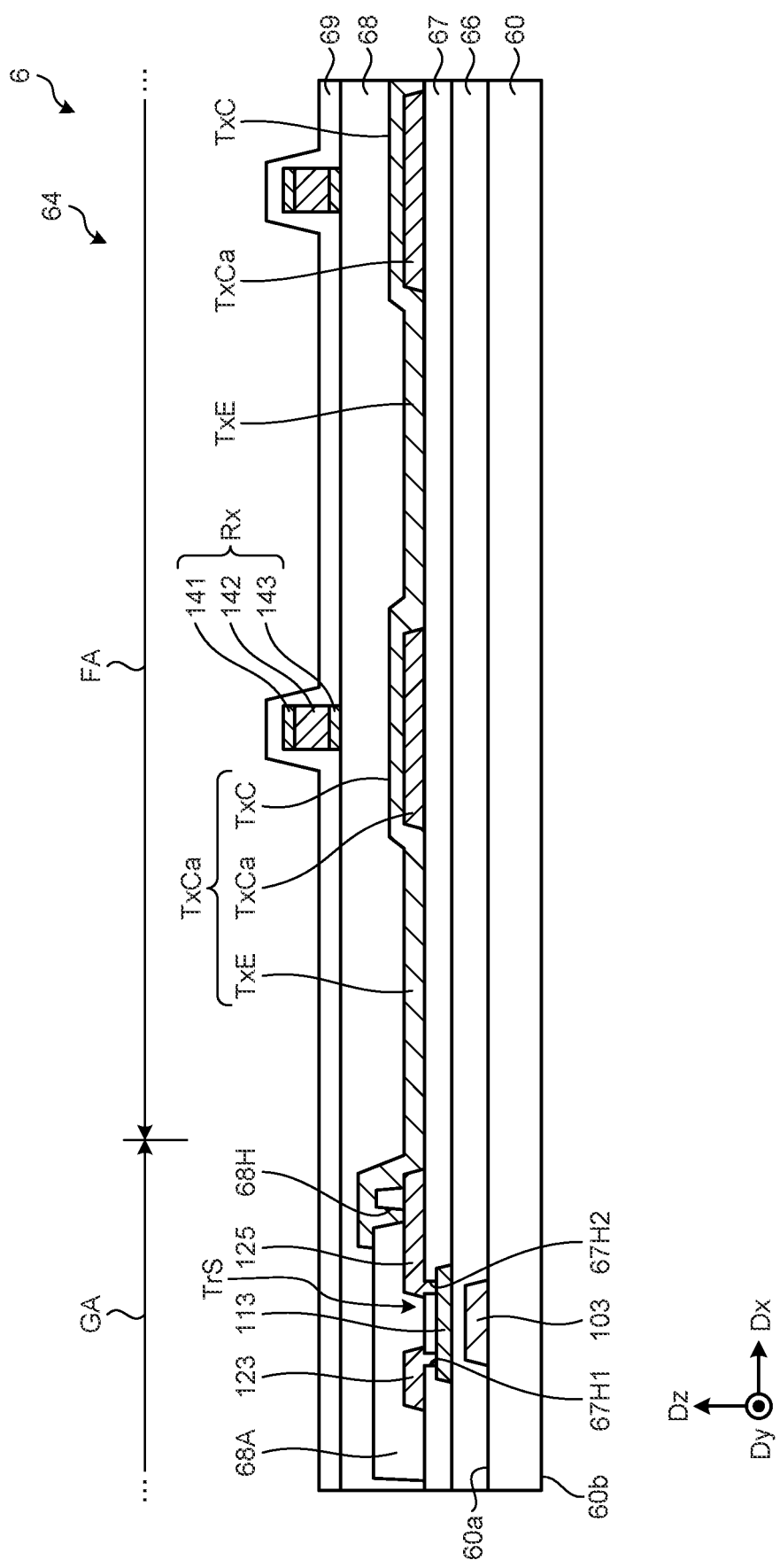
FIG. 11 is a sectional view along line XI-XI' of FIG. 10.

FIG. 11 is a sectional view along line XI-XI' of FIG. 10. To illustrate the relation between the layer structure of the detection region FA and the layer structure of the peripheral region GA, FIG. 11 illustrates the section along line XI-XI' in the detection region FA and the section of the part including the transistor TrS in the peripheral region GA by schematically connecting them. The transistor TrS is an element included in the drive electrode driver 62.

As illustrated in FIG. 11, the sensor substrate 60 has the first surface 60a and a second surface 60b opposite to the first surface 60a. The drive electrodes Tx and the detection electrodes Rx are provided on the first surface 60a of the sensor substrate 60. Specifically, insulating films 66 and 67 are layered on the first surface 60a. The drive electrodes Tx are provided on the insulating film 67. The electrode parts TxE and the metal layers TxCa are provided on the insulating film 67, and the coupling parts TxC are provided covering the metal layers TxCa. The insulating film 68 is provided on the insulating film 67 to cover the drive electrodes Tx.

In the detection region FA, the detection electrodes Rx are provided on the insulating film 68. The detection electrodes Rx are each provided at a position overlapping the coupling part TxC and the metal layer TxCa. The insulating film 68 electrically insulates the detection electrodes Rx from the drive electrodes Tx. The detection electrodes Rx each include a first metal layer 141, a second metal layer 142, and a third metal layer 143. The second metal layer 142 is provided on the third metal layer 143, and the first metal layer 141 is provided on the second metal layer 142.

The first metal layer 141 and the third metal layer 143 are made of molybdenum (Mo) or Mo alloy, for example. The second metal layer 142 is made of aluminum (Al) or Al alloy. The first metal layer 141 has reflectance of visible light lower than that of the second metal layer 142.

The insulating film 69 is provided on the detection electrodes Rx and the insulating film 68. The insulating film 69 covers the upper surface and the side surfaces of the detection electrodes Rx. The insulating film 69 is a film having a high refractive index and low reflectance, such as a silicon nitride film, a silicon oxynitride film, and an acrylic resin film.

The drive electrode Tx extends from the detection region FA to the peripheral region GA and is coupled to the transistor TrS. The transistor TrS includes a gate electrode 103, a semiconductor layer 113, a source electrode 123, and a drain electrode 125. The gate electrode 103 is provided on the sensor substrate 60. The insulating film 66 is provided on the gate electrode 103. The semiconductor layer 113 is provided on the insulating film 66.

The insulating film 67 is provided on the semiconductor layer 113. The source electrode 123 and the drain electrode 125 are provided on the insulating film 67. The source electrode 123 is coupled to the semiconductor layer 113 through a contact hole 67H1 formed in the insulating film 67. The drain electrode 125 is coupled to the semiconductor layer 113 through a contact hole 67H2 formed in the insulating film 67.

An insulating film 68A is provided on the source electrode 123 and the drain electrode 125. The drive electrode Tx is coupled to the drain electrode 125 through a contact hole 68H formed in the insulating film 68A.

Figure 12:
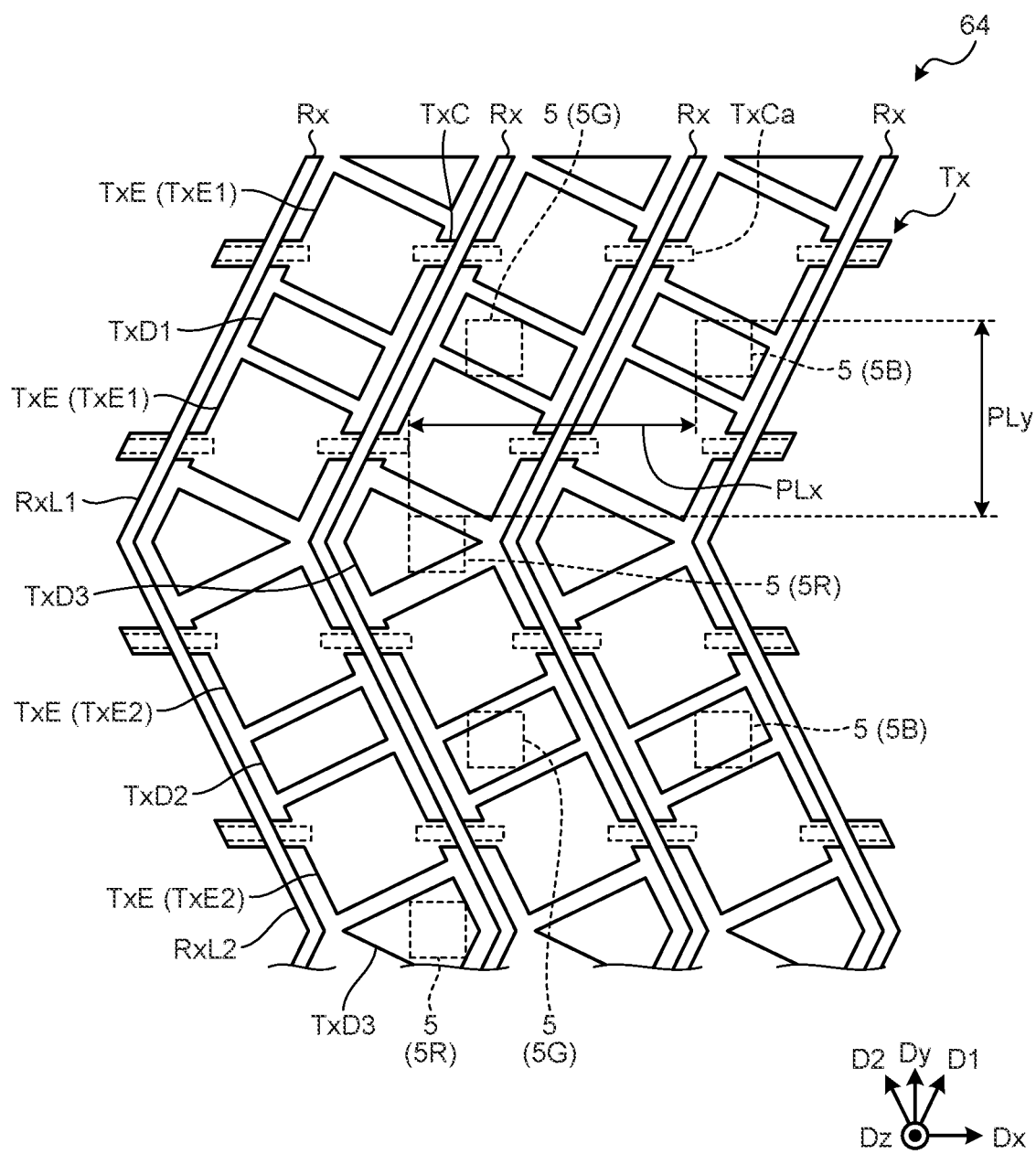
FIG. 12 is a plan view for explaining the positional relation between the drive electrodes, the detection electrodes, and light emitting elements.

FIG. 12 is a plan view for explaining the positional relation between the drive electrodes, the detection electrodes, and the light emitting elements. As illustrated in FIG. 12, the light emitting elements 5 are each disposed between the detection electrodes Rx disposed side by side in the first direction Dx in planar view and between the drive electrodes Tx disposed side by side in the second direction Dy in planar view. In other words, the light emitting elements 5 are provided in regions not overlapping the detection electrodes Rx or the drive electrodes Tx in planar view.

Specifically, the light emitting elements 5G and 5B are each disposed between the first linear parts RxL1 disposed side by side in the first direction Dx and between the first electrode parts TxE1 disposed side by side in the D1 direction. In addition, the light emitting elements 5G and 5B are each disposed between the second linear parts RxL2 disposed side by side in the first direction Dx and between the second electrode parts TxE2 disposed side by side in the D2 direction. The light emitting elements 5B and 5G are disposed side by side in the first direction Dx in a manner sandwiching the detection electrode Rx. The light emitting elements 5G and 5B are each disposed at a position overlapping the dummy electrode TxD1 or the dummy electrode TxD2.

The light emitting element 5R is disposed between the bent parts RxB disposed side by side in the first direction Dx and between the first electrode part TxE1 and the second electrode part TxE2 disposed side by side in the second direction Dy. The light emitting element 5R is disposed at a position overlapping the dummy electrode TxD3.

An arrangement pitch PLx between the light emitting elements 5 in the first direction Dx is substantially equal to the arrangement pitch Prx (refer to FIG. 10) between the detection electrodes Rx. An arrangement pitch PLy between the light emitting elements 5 in the second direction Dy is approximately one-half the arrangement pitch Pry (refer to FIG. 10) between the detection electrodes Rx. The position of the light emitting element 5R in the first direction Dx is deviated from the position of the light emitting element 5G in the first direction Dx.

The arrangement pitch PLx is the distance between the light emitting element 5 (e.g., the light emitting element 5B) positioned on one side in the first direction Dx and the light emitting element 5 (e.g., the light emitting element 5R) positioned on the other side in the first direction Dx out of the light emitting elements 5 constituting one pixel Pix. Similarly, the arrangement pitch PLy is the distance between the light emitting element 5 (e.g., the light emitting element 5B) positioned on one side in the second direction Dy and the light emitting element 5 (e.g., the light emitting element 5R) positioned on the other side in the second direction Dy out of the light emitting elements 5 constituting one pixel Pix.

With this configuration, the light emitting elements 5 are disposed at positions not overlapping at least the detection electrodes Rx. This configuration can prevent light output from the light emitting elements 5 from being reflected by the detection electrodes Rx. The light emitting elements 5 arranged in the second direction Dy are provided side by side with the first linear part RxL1, the second linear part RxL2, or the bent part RxB made of metal thin wires inclining in different directions.

With this configuration, the display apparatus 1 with the detecting device can prevent generation of unintended patterns, such as moiré, compared with a configuration in which one linear detection electrode Rx is provided side by side with a plurality of light emitting elements 5. Consequently, the display apparatus 1 with the detecting device can satisfactorily detect a fingerprint by the detecting device 6. In addition, the display apparatus 1 with the detecting device can prevent light output from the light emitting elements 5 from being unnecessarily reflected, thereby preventing deterioration of the quality of a display image.

The positions of the light emitting elements 5 illustrated in FIG. 12 are given by way of example only and may be different positions. Two or more light emitting elements 5, for example, may be disposed side by side with one linear part (the first linear part RxL1 or the second linear part RxL2). Alternatively, the positions of the light emitting elements 5R, 5G, and 5B may be switched.

First Modification

Figure 13:
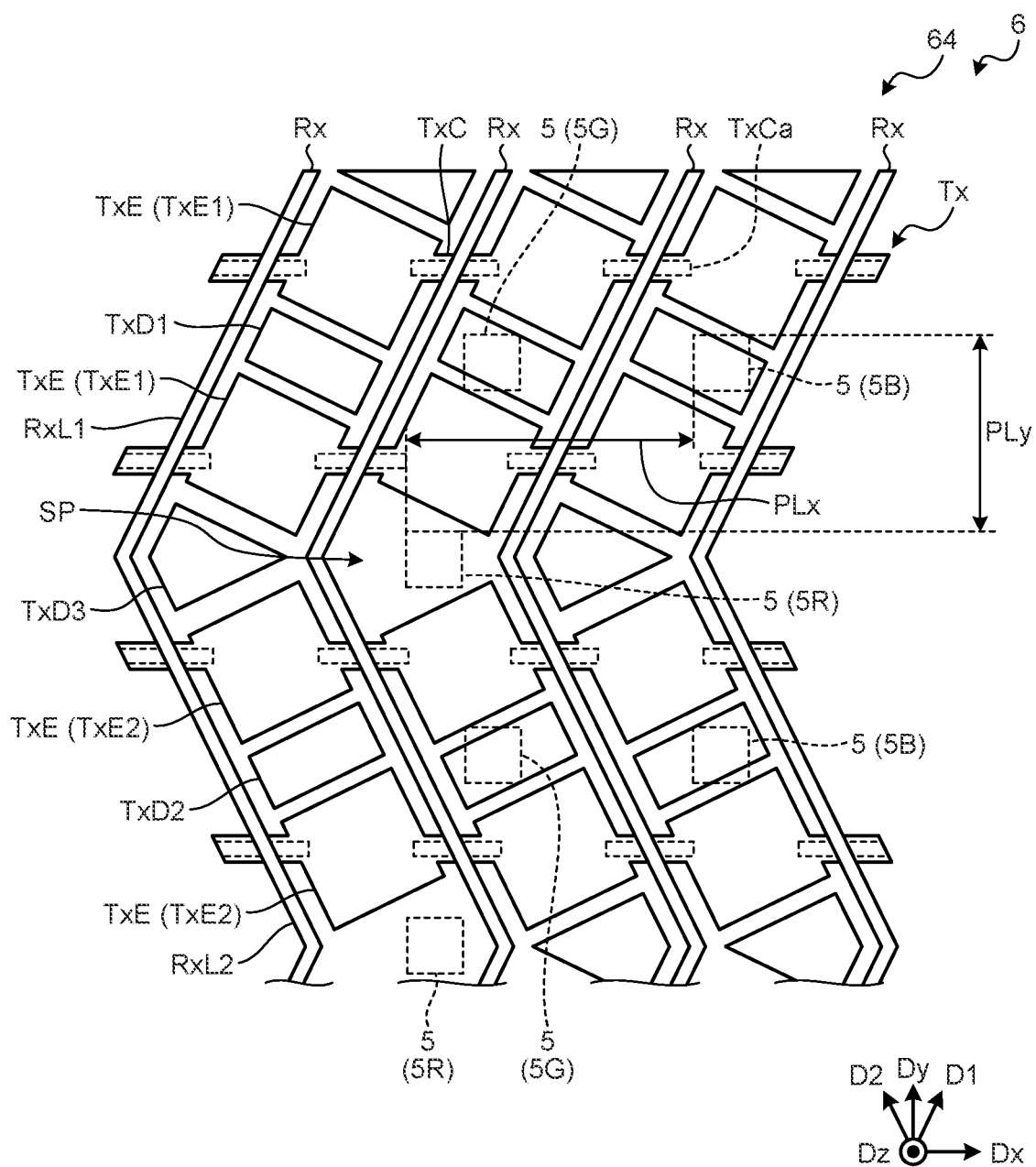
FIG. 13 is a plan view of the detecting device according to a first modification of the first embodiment.

FIG. 13 is a plan view of the detecting device according to a first modification of the first embodiment. In the following description, the same components as those described in the embodiment above are denoted by like reference numerals, and overlapping explanation thereof is omitted.

As illustrated in FIG. 13, the detecting device 6 according to the first modification is different from the first embodiment in that some of the dummy electrodes TxD are not provided. Specifically, no dummy electrode TxD3 is provided at the parts overlapping the light emitting elements 5R. In other words, the light emitting elements 5R are each provided in the region SP between the drive electrodes Tx (the first electrode part TxE1 and the second electrode part TxE2) disposed side by side in the second direction Dy. The region overlapping the light emitting element 5R is provided with the sensor substrate 60 and the insulating films 66, 67, 68, and 69 (refer to FIG. 11) of the detecting device 6.

With this configuration, light output from the light emitting element 5R travels to the display surface without passing through the dummy electrode TxD3. In other words, the first modification can prevent reduction in transmittance of light output from the light emitting element 5R compared with the first embodiment. Consequently, the first modification can reduce the difference between the luminance of red light and the luminance of blue and green light displayed on the display surface if the luminous efficacy of the light emitting element 5R is lower than that of the light emitting elements 5G and 5B.

While no dummy electrode TxD3 is provided at the parts overlapping the light emitting elements 5R in FIG. 13, the present modification is not limited thereto. Similarly to the light emitting elements 5R, no dummy electrode TxD1 or TxD2 may be provided at the parts overlapping the light emitting elements 5G and 5B.

Second Modification

Figure 14:
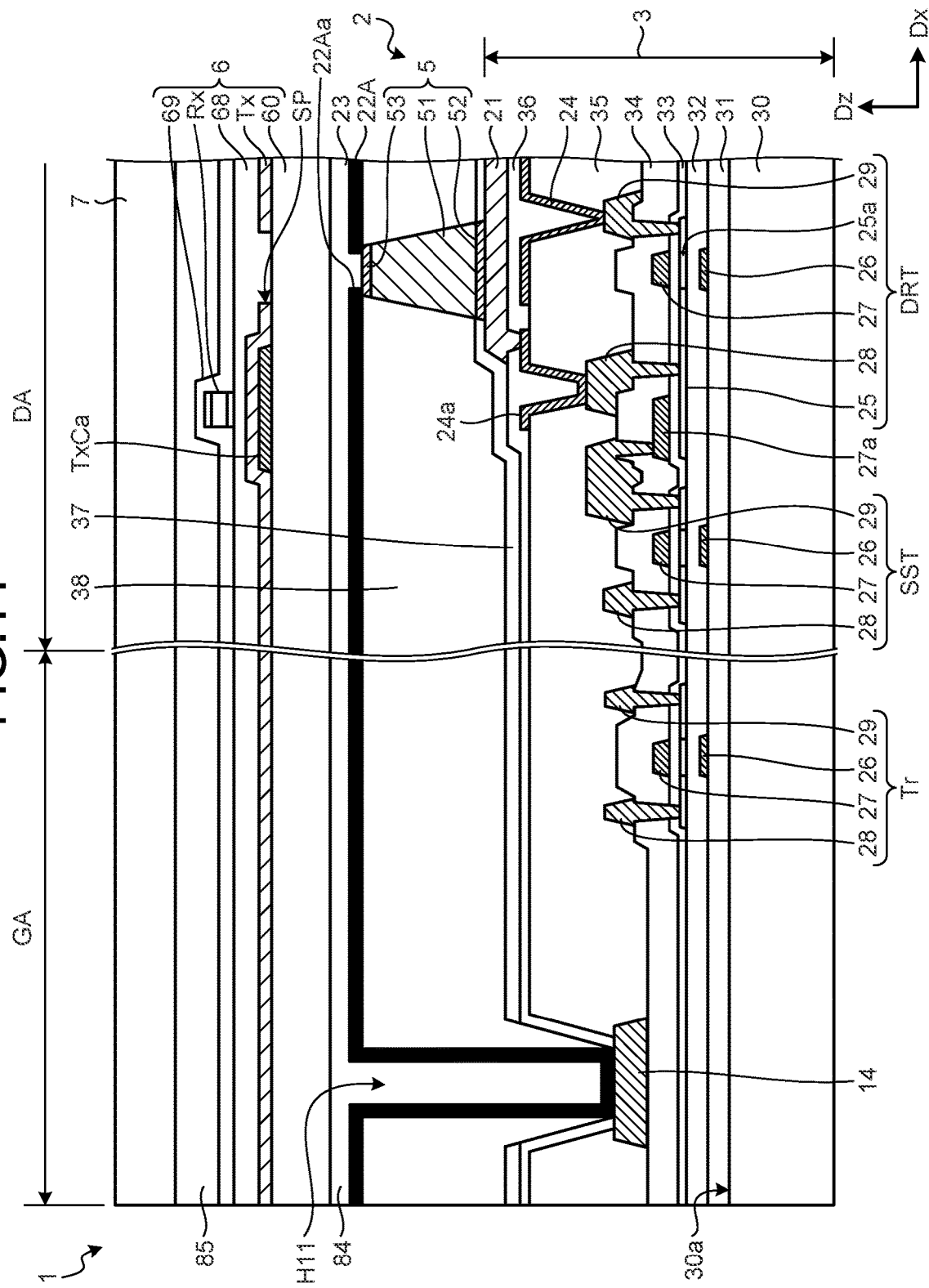
FIG. 14 is a sectional view of the display apparatus with the detecting device according to a second modification of the first embodiment.

FIG. 14 is a sectional view of the display apparatus with the detecting device according to a second modification of the first embodiment. In the display apparatus 1 with the detecting device according to the second modification, a cathode electrode 22A is made of a black electric conductor as illustrated in FIG. 14. Examples of the material of the black electric conductor include, but are not limited to, carbon, metal that shows black by thin-film interference, etc. The cathode electrode 22A has an opening 22Aa at a part overlapping the cathode terminal 53 of the light emitting element 5. The cathode electrode 22A is coupled to the cathode terminal 53 on the periphery of the cathode terminal 53. In the second modification, the black member 23 (refer to FIG. 6) is not provided on the cathode electrode 22A, and the adhesive layer 84 is provided on the cathode electrode 22A and in the opening 22Aa.

The second modification is different from the first embodiment in that no translucent electric conductor serving as the cathode electrode 22 is provided on the light emitting element 5. Consequently, the display apparatus 1 with the detecting device can increase the extraction efficiency of light output from the light emitting element 5. The configuration according to the second modification is also applicable to the first modification described above.

Third Modification

Figure 15:
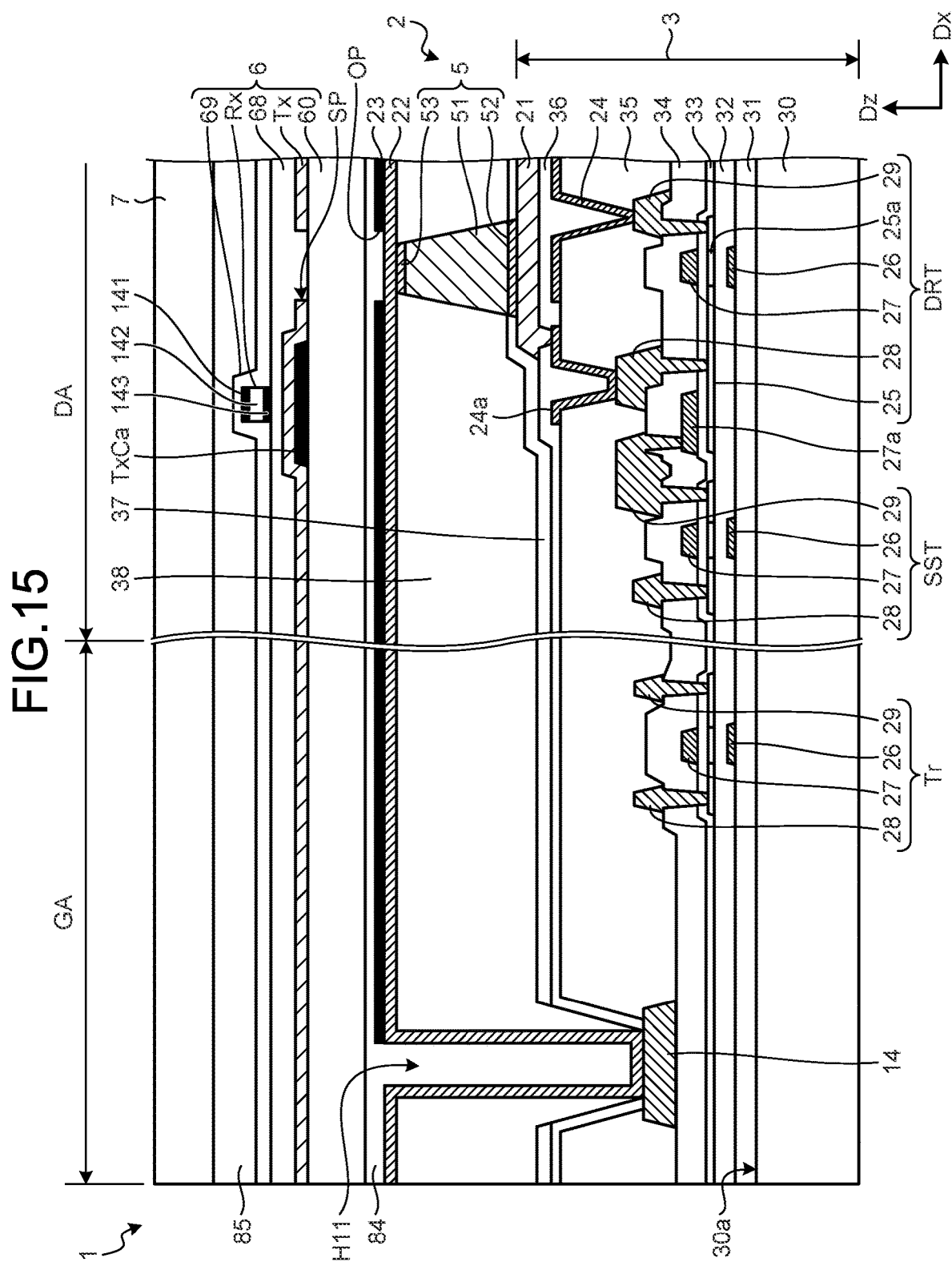
FIG. 15 is a sectional view of the display apparatus with the detecting device according to a third modification of the first embodiment.

FIG. 15 is a sectional view of the display apparatus with the detecting device according to a third modification of the first embodiment. In the display apparatus 1 with the detecting device according to the third modification, the detection electrode Rx includes a black electric conductor as illustrated in FIG. 15. Specifically, the first metal layer 141 and the third metal layer 143 are made of a black electric conductor. In the detection electrode Rx, the first metal layer 141 positioned in the outermost layer and the third metal layer 143 are made of a black electric conductor, and the second metal layer 142 is made of aluminum (Al) or Al alloy as described above. This configuration can prevent reduction in electric conductivity of the detection electrode Rx with a black electric conductor.

The drive electrode Tx includes the metal layer TxCa made of a black electric conductor. The metal layer TxCa and the coupling part TxC are layered.

With this configuration, the third modification can prevent external light incident on the display surface from being reflected by the detection electrode Rx and the metal layer TxCa. As a result, the display apparatus 1 with the detecting device can prevent reflection of external light, thereby preventing reduction in luminance of an image displayed on the display surface. The third modification does not necessarily include the circularly polarizing plate 7 because it prevents reflection of external light in the display device 2 and the detecting device 6.

Both the detection electrodes Rx and the drive electrodes Tx according to the third modification do not necessarily include the black electric conductor. One of the detection electrodes Rx and the drive electrodes Tx may include the black electric conductor. The configuration according to the third modification is also applicable to the first and the second modifications described above.

Fourth Modification

Figure 16:
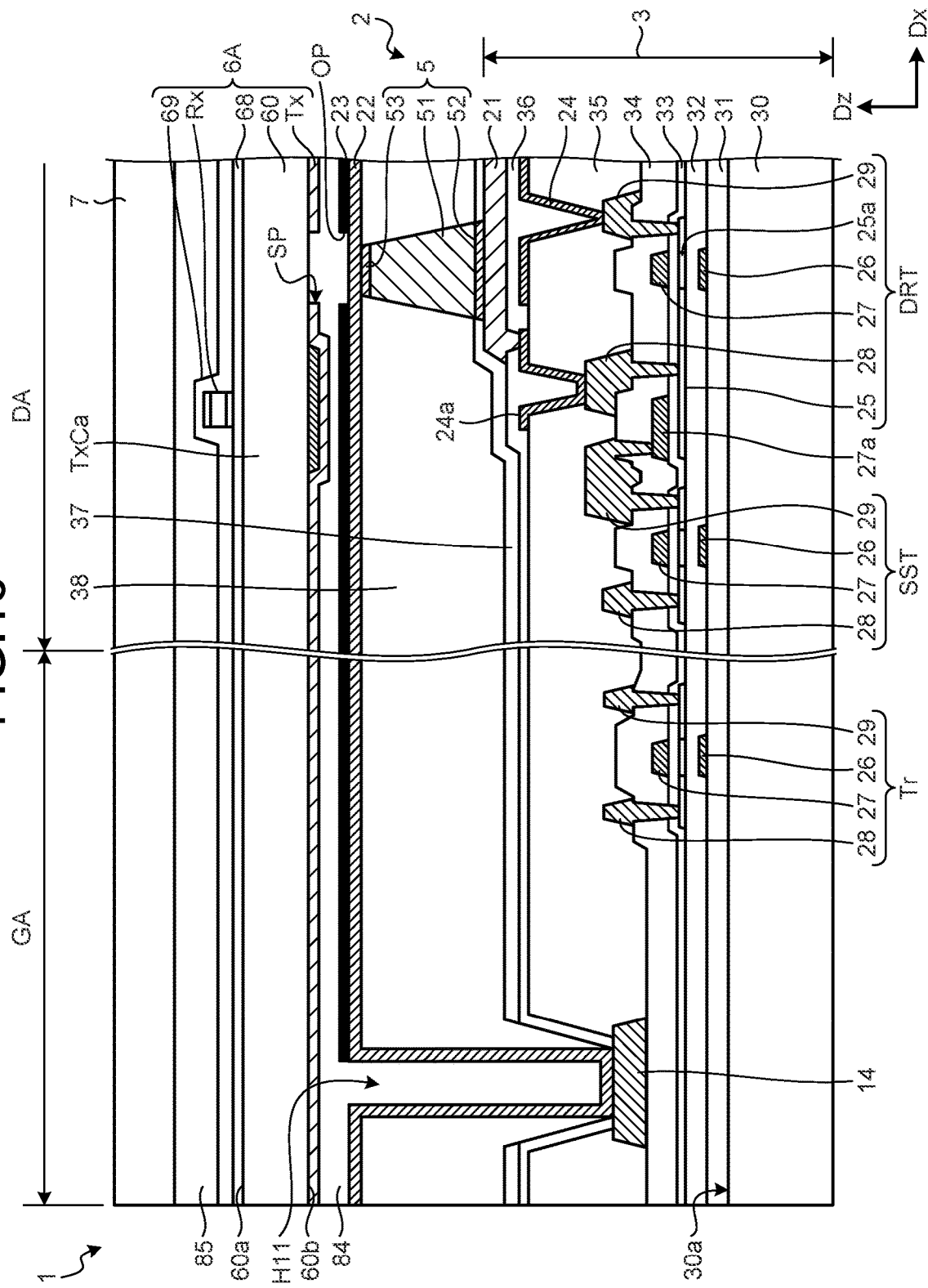
FIG. 16 is a sectional view of the display apparatus with the detecting device according to a fourth modification of the first embodiment.

FIG. 16 is a sectional view of the display apparatus with the detecting device according to a fourth modification of the first embodiment. In the display apparatus 1 with the detecting device according to the fourth modification, a detecting device 6A has a different multilayered structure as illustrated in FIG. 16. Specifically, the detection electrodes Rx are provided on the first surface 60a of the sensor substrate 60, and the drive electrodes Tx are provided on the second surface 60b. The drive electrodes Tx, the sensor substrate 60, and the detection electrodes Rx are provided in order on the light emitting elements 5 in the third direction Dz. The configuration of the detection electrodes Rx and the drive electrodes Tx in planar view and the positions of the light emitting elements 5 are not explained herein in detail because they are the same as those illustrated in FIGS. 10 and 12.

In the fourth modification, the drive electrode driver 62 (refer to FIG. 8) is provided not in the peripheral region GA of the sensor substrate 60 but in an IC coupled via the wiring substrate 65. The drive electrodes Tx are coupled to the IC via coupling wiring provided in the peripheral region GA.

The positions of the detection electrodes Rx and the drive electrodes Tx may be switched. In other words, the drive electrodes Tx may be provided on the first surface 60a of the sensor substrate 60, and the detection electrodes Rx may be provided on the second surface 60b. While the detection electrodes Rx are provided on the sensor substrate 60 with the insulating film 68 interposed therebetween, the insulating film 68 is not necessarily provided. The configuration according to the fourth modification is also applicable to the first to the third modifications described above.

Second Embodiment

Figure 17:
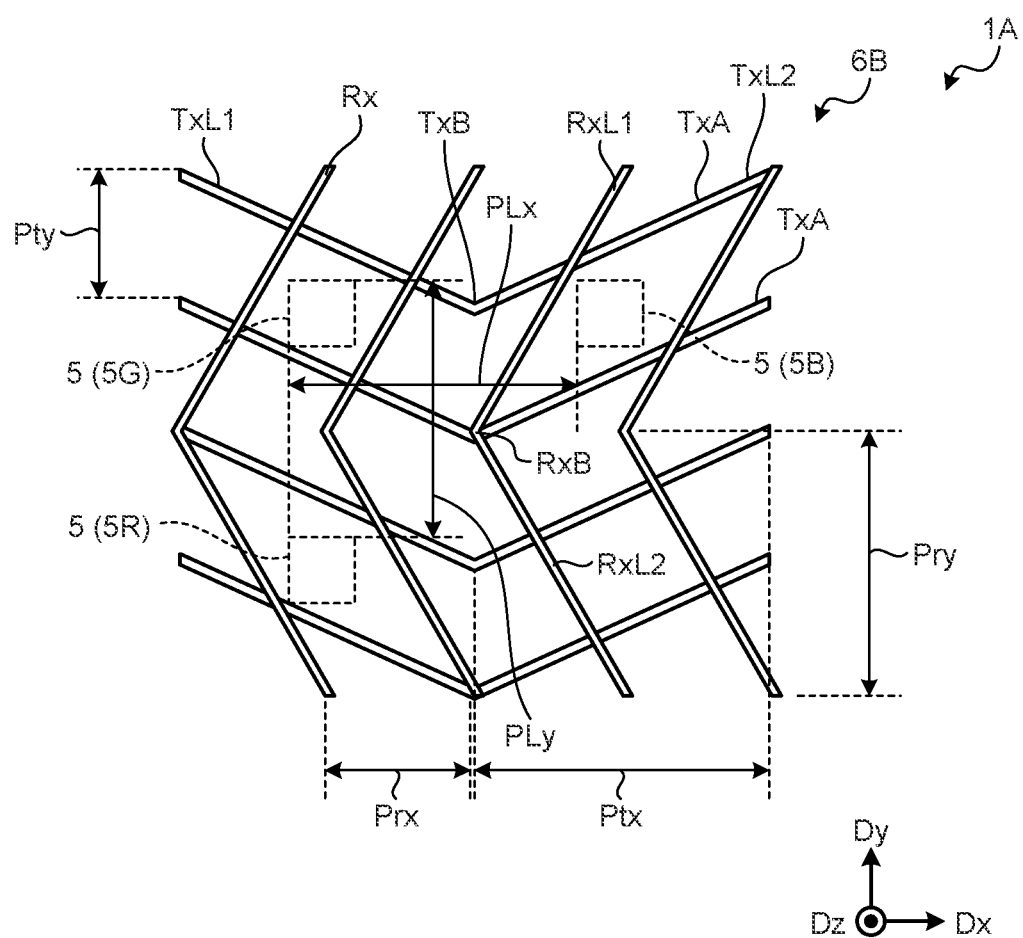
FIG. 17 is a plan view of the detecting device included in the display apparatus with the detecting device according to a second embodiment.

FIG. 17 is a plan view of the detecting device included in the display apparatus with the detecting device according to a second embodiment. In a display apparatus 1A with the detecting device according to the second embodiment, a plurality of drive electrodes TxA are metal thin wires as illustrated in FIG. 17.

Specifically, the drive electrode TxA includes a plurality of third linear parts TxL1, a plurality of fourth linear parts TxL2, and a plurality of bent parts TxB (second bent part). The fourth linear part TxL2 extends in a direction intersecting the third linear part TxL1. The third linear part TxL1 and the fourth linear part TxL2 extend in directions intersecting the first linear part RxL1 and the second linear part RxL2 of the detection electrode Rx. The bent part TxB couples the third linear part TxL1 and the fourth linear part TxL2.

An arrangement pitch Ptx of the drive electrode TxA is the distance between the bent parts TxB in the first direction Dx in each of the drive electrodes TxA. An arrangement pitch Pty is the distance between the bent parts TxB in the second direction Dy in the drive electrodes TxA disposed side by side. The arrangement pitch Ptx according to the present embodiment is larger than the arrangement pitch Pty, for example. The arrangement pitch Ptx of the drive electrode TxA is approximately twice the arrangement pitch Prx of the detection electrode Rx. The arrangement pitch Pty of the drive electrode TxA is approximately one-half the arrangement pitch Pry of the detection electrode Rx.

The light emitting elements 5 are each disposed between the detection electrodes Rx disposed side by side in the first direction Dx and between the drive electrodes TxA disposed side by side in the second direction Dy. Specifically, the light emitting element 5G is provided in a region surrounded by the third linear parts TxL1 disposed side by side in the second direction Dy and the first linear parts RxL1 disposed side by side in the first direction Dx. The light emitting element 5B is provided in a region surrounded by the fourth linear parts TxL2 disposed side by side in the second direction Dy and the first linear parts RxL1 disposed side by side in the first direction Dx. The light emitting element 5R is provided in a region surrounded by the third linear parts TxL1 disposed side by side in the second direction Dy and the second linear parts RxL2 disposed side by side in the first direction Dx.

Figure 18:
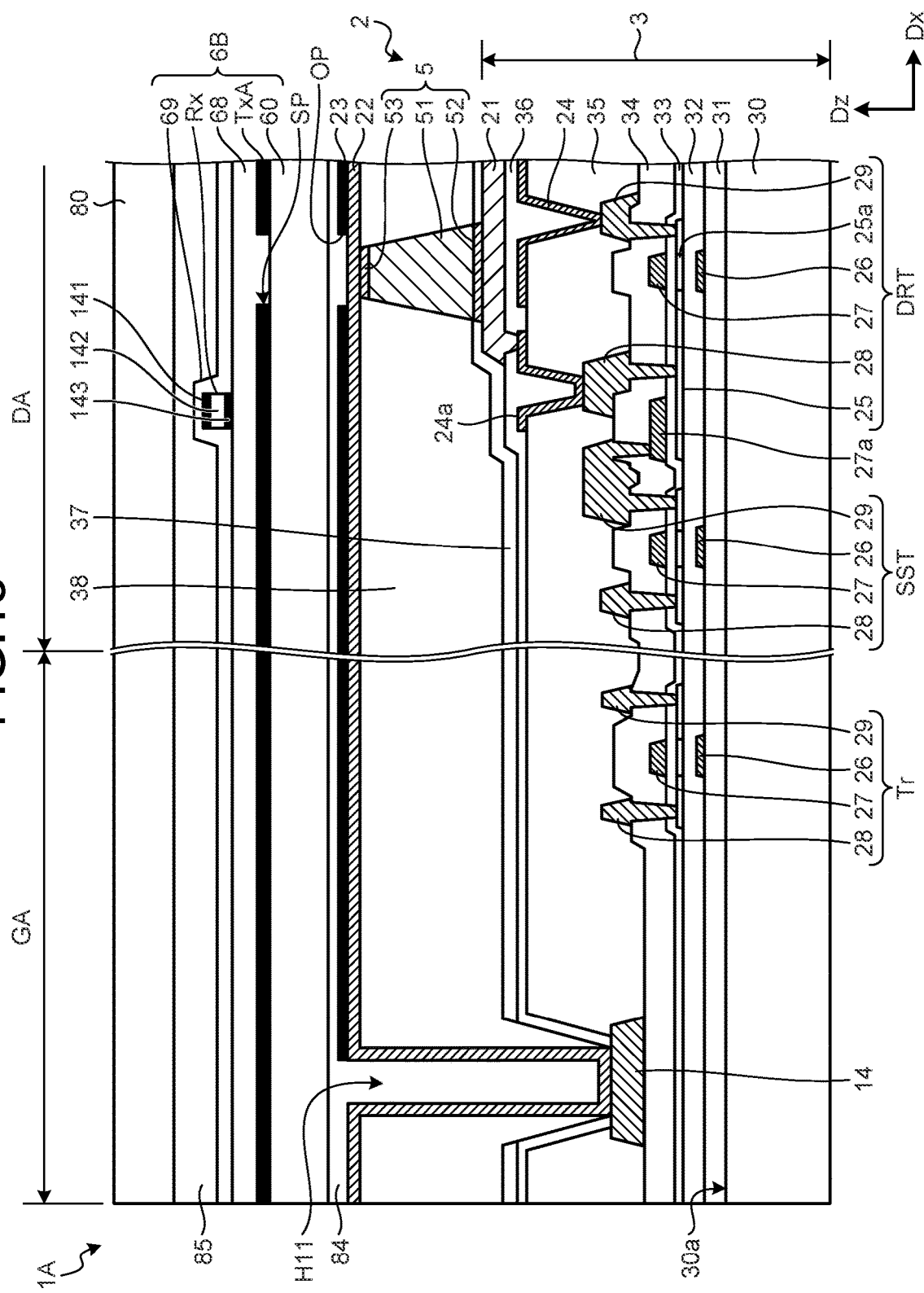
FIG. 18 is a sectional view of the display apparatus with the detecting device according to the second embodiment.

FIG. 18 is a sectional view of the display apparatus with the detecting device according to the second embodiment. As illustrated in FIG. 18, the drive electrodes TxA of a detecting device 6B are provided on the first surface 60a of the sensor substrate 60. The detection electrodes Rx are provided on the drive electrodes TxA with the insulating film 68 interposed therebetween. The metal layers TxCa (refer to FIG. 10) need not be provided at the intersections of the drive electrodes TxA and the detection electrodes Rx because the drive electrodes TxA are metal thin wires.

The drive electrodes TxA and the detection electrodes Rx are made of a black electric conductor. In this case, the circularly polarizing plate 7 is not provided, and the cover member 80 is provided on the detecting device 6B with the adhesive layer 85 interposed therebetween. The second embodiment may include the circularly polarizing plate 7. The drive electrode TxA is not limited to a single layer. The drive electrode TxA may have a multilayered structure composed of a plurality of metal layers like the detection electrode Rx.

The detecting device 6B according to the present embodiment can reduce the resistance of the drive electrode TxA. In addition, the detecting device 6B can reduce the capacitance between the drive electrode TxA and the detection electrode Rx. The configuration according to the present embodiment is also applicable to the first to the fourth modifications described above.

The parts that have been described as the anode terminal 52 and the cathode terminal 53 above are not limited to those in the present specification and may be exchanged depending on the coupling direction of the light emitting element 5 and the application direction of the voltage. While one electrode of the light emitting element 5 is disposed at a lower part, and the other electrode is disposed at an upper part in FIGS. 6, 14 to 16, and 18, both the electrodes may be disposed at a lower part, that is, on the side facing the array substrate 3. In other words, the display apparatus with detecting device 1 does not necessarily have a face-up structure in which the upper part of the light emitting element 5 is coupled to the cathode electrode 22. The display apparatus with detecting device 1 may have what is called a face-down structure in which the lower part of the light emitting element 5 is coupled to the anode electrode 21 and the cathode electrode 22.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display apparatus with a detecting device comprising:
a substrate;
a plurality of light emitting elements on the substrate;
a plurality of detection electrodes arranged in a first direction parallel to the substrate, the detection electrodes including a first detection electrode and a second detection electrode; and
a plurality of drive electrodes arranged in a second direction intersecting the first direction and provided intersecting the detection electrodes in planar view seen from a direction perpendicular to the substrate,
wherein
the detection electrodes each comprise:
  a plurality of first linear parts;
  a plurality of second linear parts extending in a direction intersecting the first linear parts; and
  a bent part that couples the first linear part and the second linear part,
a dummy electrode having a quadrangle shape in overall is provided between the drive electrodes disposed side by side in the second direction,
the light emitting elements are each disposed in a region overlapping the dummy electrode in planar view seen from the direction perpendicular to the substrate,
the drive electrodes each having a polygonal shape are coupled to each other via a coupling part in the first direction, the drive electrodes including a first drive electrode and a second drive electrode,
only a single dummy electrode having the quadrangle shape in overall is surrounded by:
  the first drive electrode and the second drive electrode each having the polygonal shape and that are arranged in the second direction; and
  the first detection electrode and the second detection electrode adjacent to each other in the first direction, and
the dummy electrode has:
  a first side parallel to opposing sides of the first drive electrode in overall;
  a second side parallel to opposing sides of the second drive electrode in overall;
  a third side parallel to opposing sides of the first detection electrode; and
  a fourth side parallel to opposing sides the second detection electrode.

2. The display apparatus according to claim 1, wherein the detection electrodes are metal thin wires, and
  the drive electrodes are translucent electric conductors.

3. A display apparatus with a detecting device comprising:
a substrate;
a plurality of light emitting elements on the substrate;
a plurality of detection electrodes arranged in a first direction parallel to the substrate, the detection electrodes including a first detection electrode and a second detection electrode; and
a plurality of drive electrodes arranged in a second direction intersecting the first direction and provided intersecting the detection electrodes in planar view seen from a direction perpendicular to the substrate,
wherein
the detection electrodes each comprise:
   a plurality of first linear parts;
   a plurality of second linear parts extending in a direction intersecting the first linear parts; and
   a bent part that couples the first linear part and the second linear part,
a dummy electrode having a quadrangle shape in overall is provided between the drive electrodes disposed side by side in the second direction,
the light emitting elements are each disposed between the drive electrodes disposed side by side in the second direction in planar view seen from the direction perpendicular to the substrate,
the drive electrodes each having a polygonal shape are coupled to each other via a coupling part in the first direction, the drive electrodes including a first drive electrode and a second drive electrode,
only a single dummy electrode having the quadrangle shape in overall is surrounded by:
   the first drive electrode and the second drive electrode each having the polygonal shape and that are arranged in the second direction; and
   the first detection electrode and the second detection electrode adjacent to each other in the first direction, and
the dummy electrode has:
   a first side parallel to opposing sides of the first drive electrode in overall;
   a second side parallel to opposing sides of the second drive electrode in overall;
   a third side parallel to opposing sides of the first detection electrode; and
   a fourth side parallel to opposing sides the second detection electrode.

4. The display apparatus according to claim 3, wherein
the detection electrodes are metal thin wires, and
   the drive electrodes are translucent electric conductors.

5. The display apparatus with the detecting device according to claim 3, wherein
the drive electrodes each comprise:
   a plurality of electrode parts disposed in a manner separated from one another in planar view; and
   the coupling part that couples electrode parts disposed side by side out of the electrode parts, and
the detection electrodes are each disposed between the electrode parts disposed side by side and intersect the coupling part in planar view seen from the direction perpendicular to the substrate.

6. A display apparatus with a detecting device comprising:
a substrate;
a plurality of light emitting elements on the substrate;
a plurality of detection electrodes arranged in a first direction parallel to the substrate, the detection electrodes including a first detection electrode and a second detection electrode; and
a plurality of drive electrodes arranged in a second direction intersecting the first direction and provided intersecting the detection electrodes in planar view seen from a direction perpendicular to the substrate,
wherein
the detection electrodes each comprise:
   a plurality of first linear parts;
   a plurality of second linear parts extending in a direction intersecting the first linear parts; and
   a bent part that couples the first linear part and the second linear part,
a dummy electrode having a quadrangle shape in overall is provided between the drive electrodes disposed side by side in the second direction,
the light emitting element comprises a first terminal and a second terminal,
the display apparatus further comprises:
   a transistor electrically coupled to the light emitting element;
   a first electrode electrically coupled to the transistor and configured to supply a first potential to the first terminal; and
   a second electrode configured to supply a second potential different from the first potential to the second terminal,
the second electrode is a black electric conductor and has an opening in a region overlapping the second terminal,
the drive electrodes each having a polygonal shape are coupled to each other via a coupling part in the first direction, the drive electrodes including a first drive electrode and a second drive electrode,
only a single dummy electrode having the quadrangle shape in overall is surrounded by:
   the first drive electrode and the second drive electrode each having the polygonal shape and that are arranged in the second direction; and
   the first detection electrode and the second detection electrode adjacent to each other in the first direction, and
the dummy electrode has:
   a first side parallel to opposing sides of the first drive electrode in overall;
   a second side parallel to opposing sides of the second drive electrode in overall;
   a third side parallel to opposing sides of the first detection electrode; and
   a fourth side parallel to opposing sides the second detection electrode.

7. The display apparatus according to claim 6, wherein
the detection electrodes are metal thin wires, and
   the drive electrodes are translucent electric conductors.

* * * * *